(12) United States Patent
Won et al.

(10) Patent No.: US 9,281,414 B2
(45) Date of Patent: Mar. 8, 2016

(54) VERTICAL CELL-TYPE SEMICONDUCTOR DEVICE HAVING PROTECTIVE PATTERN

(71) Applicants: Jin-Yeon Won, Seoul (KR); Joon-Hee Lee, Seongnam-si (KR); Seung-Woo Paek, Yongin-si (KR); Dong-Seog Eun, Seongnam-si (KR)

(72) Inventors: Jin-Yeon Won, Seoul (KR); Joon-Hee Lee, Seongnam-si (KR); Seung-Woo Paek, Yongin-si (KR); Dong-Seog Eun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/151,288

(22) Filed: Jan. 9, 2014

(65) Prior Publication Data

US 2014/0284695 A1    Sep. 25, 2014

(30) Foreign Application Priority Data

Mar. 19, 2013    (KR) .................. 10-2013-0029103

(51) Int. Cl.
*H01L 29/792* (2006.01)
*H01L 27/115* (2006.01)
*H01L 29/66* (2006.01)

(52) U.S. Cl.
CPC ........ *H01L 29/7926* (2013.01); *H01L 27/1157* (2013.01); *H01L 27/11582* (2013.01); *H01L 29/66833* (2013.01)

(58) Field of Classification Search
None
See application file for complete search history.

(56) References Cited

U.S. PATENT DOCUMENTS

| 7,679,133 | B2 | 3/2010 | Son et al. |
| 7,902,591 | B2 | 3/2011 | Kito et al. |
| 7,969,789 | B2 * | 6/2011 | Katsumata et al. ...... 365/185.28 |
| 8,017,993 | B2 | 9/2011 | Kidoh et al. |
| 8,581,321 | B2 * | 11/2013 | Son et al. ...................... 257/314 |
| 2011/0001178 | A1 | 1/2011 | Iwase et al. |
| 2012/0012920 | A1 | 1/2012 | Shin et al. |
| 2012/0058629 | A1 * | 3/2012 | You et al. ...................... 438/479 |
| 2012/0120728 | A1 | 5/2012 | Kim et al. |

FOREIGN PATENT DOCUMENTS

| JP | 2009-295837 A | 12/2009 |
| JP | 2011-066348 A | 3/2011 |

* cited by examiner

*Primary Examiner* — Jerome Jackson, Jr.
*Assistant Examiner* — Steven B Gauthier
(74) *Attorney, Agent, or Firm* — Harness, Dickey & Pierce, P.L.C.

(57) ABSTRACT

According to example embodiments of inventive concepts, a semiconductor device includes: a substrate, and a stacked structure including interlayer insulating layers and gate electrodes alternately stacked on the substrate. The stacked structure defines a through-hole over the substrate. The gate electrodes each include a first portion between the through-hole and a second portion of the gate electrodes. A channel pattern may be in the through-hole. A tunneling layer may surround the channel pattern. A charge trap layer may surround the tunneling layer, and protective patterns may surround the first portions of the gate electrodes. The protective patterns may be between the first portions of the gate electrodes and the charge trap layer.

22 Claims, 20 Drawing Sheets

VERTICAL CELL-TYPE SEMICONDUCTOR DEVICE HAVING PROTECTIVE PATTERN

CROSS-REFERENCE TO RELATED APPLICATION

This application claims priority under 35 U.S.C. §119 to Korean Patent Application No. 10-2013-0029103, filed on Mar. 19, 2013, the disclosure of which is hereby incorporated by reference in its entirety.

BACKGROUND

1. Field

The present disclosure relates to a vertical cell-type semiconductor device having a protective pattern, and/or a method of fabricating the same.

2. Description of Related Art

As integrated circuits are downscaled faster and faster, a vertical cell-type semiconductor device in which components formed in a vertical direction, has been proposed.

In a process of fabricating the vertical cell-type semiconductor device, it may be desirable to limit (and/or prevent) the components of the semiconductor device from being damaged by an etchant used to remove sacrificial layers, and to reduce (and/or minimize) voids or seams from being present in gate electrodes when the gate electrodes are formed.

SUMMARY

Example embodiments of inventive concepts relate to a vertical cell-type semiconductor device and/or a method of fabricating the same.

Example embodiments of inventive concepts also relate to a vertical cell-type semiconductor device having a protective pattern resistant to a wet etching process, and a method of fabricating the same.

Example embodiments of inventive concepts relate to a vertical cell-type semiconductor device having protective patterns of a new type, which are configured to remove or reduce (and/or minimize) voids or seams in gate electrodes when the gate electrodes are formed, and/or a method of fabricating the same.

According to example embodiments of inventive concepts, a semiconductor device includes: a substrate; a stacked structure including interlayer insulating layers and gate electrodes alternately stacked on the substrate, the stacked structure defining a through-hole, each of the gate electrodes including a portion in which a vertical width thereof is reduced with the approach to one end thereof; and a vertical structure filling the through-hole. The vertical structure includes a gap-fill pattern in a middle of the through-hole, a channel pattern surrounding an outer surface of the gap-fill pattern, and a gate dielectric layer surrounding an outer surface of the channel pattern. The gate dielectric layer includes a tunneling layer in contact with the channel pattern, a charge trap layer in contact with the tunneling layer, a barrier layer in contact with the charge trap layer, and protective patterns. Each one of the protective patterns is between the barrier layer and one of the gate electrodes, and each one of the protective patterns extends between two of the interlayer insulating layers and the protective patterns surround the portions the gate electrodes in which the vertical width thereof is reduced.

In example embodiments, the protective patterns may include an oxide of silicon, such as oxidized silicon.

In example embodiments, each one of the gate electrodes may include an upper surface opposite a lower surface, a first lateral surface opposite a second lateral surface, and an upper inclined surface opposite a lower inclined surface. The first lateral surface may connect one end of the upper surface to one end of the lower surface. The upper inclined surface connected to one end of the second lateral surface and an other end of the upper surface, and the lower inclined surface may connect an other end of the second lateral surface and an other end of the lower surface. A length of the second lateral surface may be shorter than a length of the first lateral surface.

In example embodiments, each one of the protective patterns may include an upper part between a lower surface of one of the interlayer insulating layers above and the upper inclined surface of an adjacent one of the gate electrodes, a lower part between the lower surface of one of the interlayer insulating layers below and the lower inclined surface of the adjacent one of the gate electrodes, and a body part connecting the upper part and the lower part.

In example embodiments, the upper part of each one of the protective patterns may include an inclined inner surface in contact with the upper inclined surface of one of the gate electrodes, and the lower part of each one of the protective patterns may include an inclined inner surface in contact with the lower inclined surface of one of the gate electrodes.

In example embodiments, the semiconductor device may further include blocking layers. Each one of the blocking layers may have one surface in contact with the upper surface, lower surface, upper inclined surface, lower inclined surface, and second lateral surface of one of the gate electrodes. Each one of the blocking layers may have an other surface in contact with parts of two interlayer insulating layers, the inclined upper and lower inner surfaces and one surface of the body part of one of the protective patterns.

In example embodiments, the body part of each one of the protective patterns may include a protrusion that protrudes into the through-hole.

In example embodiments, the barrier layer may contact exposed surfaces of the interlayer insulating layers and the protrusions of the body parts of the protective patterns.

In example embodiment, a contact electrode may be on the gap-fill pattern and contact the channel pattern.

In example embodiments, the semiconductor device may further include: capping layers on the stacked structure, wherein the capping layers may define a hole exposing an upper surface of the contact electrode.

In example embodiments, a conductive interconnection may be on the capping layers. The conductive interconnection may be electrically connected to the exposed contact electrode.

According to example embodiments of inventive concepts, a semiconductor device includes: a substrate, a stacked structure including interlayer insulating layers and gate electrodes alternately stacked on the substrate, the stacked structure defining a through-hole, each of the gate electrodes including a portion in which a vertical width thereof is reduced with the approach to one end thereof; and a vertical structure in the through-hole. The vertical structure includes a gap-fill pattern in a middle of the through-hole, a channel pattern surrounding an outer surface of the gap-fill pattern, and a gate dielectric layer surrounding an outer surface of the channel pattern. The gate dielectric layer includes a tunneling layer in contact with the channel pattern, a charge trap layer in contact with the tunneling layer, a protective layer in contact with the charge trap layer, and protective patterns that are integral with the protective layer. The protective patterns extend to the gate electrodes, and surround the portions of the gate electrodes in which the vertical width is reduced.

According to example embodiments of inventive concepts, a semiconductor device includes: a substrate; a stacked structure including interlayer insulating layers and gate electrodes alternately stacked on the substrate, the stacked structure defining a through-hole over the substrate, the gate electrodes each including a first portion between the through-hole and a second portion of the gate electrodes; a channel pattern extending vertically in the through-hole over the substrate; a tunneling layer surrounding the channel pattern; a charge trap layer surrounding the tunneling layer; and protective patterns surrounding the first portions of the gate electrodes. The protective patterns are between the first portions of the gate electrodes and the charge trap layer.

In example embodiments, the first portions of the gate electrodes may each have a thickness that gradually reduces from the second portions of the gate electrodes towards the through-hole, and the protective patterns may be arranged so they do not surround the second portions of the gate electrodes.

In example embodiments, a barrier layer may be between the protective patterns and the charge trap layer.

In example embodiments, a protective layer may extend vertically in the through-hole between the charge trap layer and the protective patterns. Each one of the protective patterns may extend from a side of the protective layer to surround the first portion of one of the gate electrodes.

In example embodiments, the protective patterns may include an oxide of silicon, the interlayer insulating layer may include an oxide, and the oxide of silicon in the protective patterns may be more compact than the oxide of the interlayer insulating layers.

Details of example embodiments of inventive concepts are included in the detailed description and drawings.

BRIEF DESCRIPTION OF THE DRAWINGS

The foregoing and other features and advantages of example embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1A:
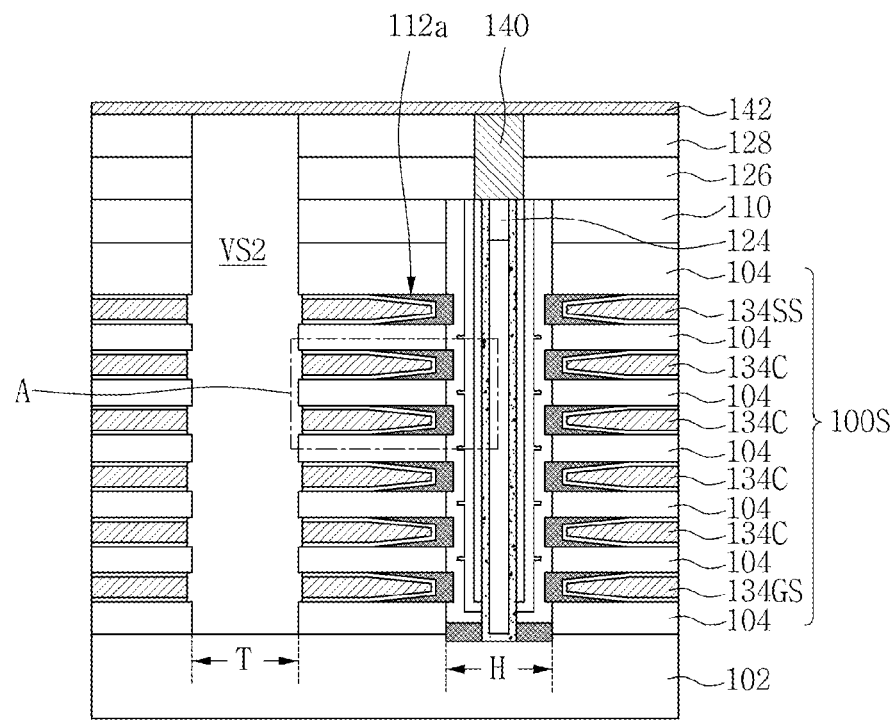
FIG. 1A is a cross-sectional view showing a vertical cell-type semiconductor device according to example embodiments of inventive concepts.

Example embodiments of inventive concepts will now be described more fully with reference to the accompanying drawings in which some embodiments are shown. These example embodiments of inventive concepts may, however, be embodied in different forms and should not be construed as limited to the embodiments set forth herein. Rather, these example embodiments of inventive concepts are provided so that this disclosure is thorough and complete and fully convey the scope of inventive concepts to those skilled in the art. In the drawings, the sizes and relative sizes of layers and regions may be exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (e.g., "between" versus "directly between," "adjacent" versus "directly adjacent," "on" versus "directly on", etc.). As used herein the term "and/or" includes any and all combinations of one or more of the associated listed items.

It will be understood that, although the terms first, second, A, B, etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe particular embodiment and is not intended to limit the scope of example embodiments of inventive concepts. The articles "a," "an," and "the" are singular in that they have a single referent, however the use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein are to be interpreted as is customary in the art to which example embodiments of inventive concepts belong. It will be further understood that terms in common usage should also be interpreted as is customary in the relevant art and not in an idealized or overly formal sense unless expressly so defined herein.

Figure 1B:
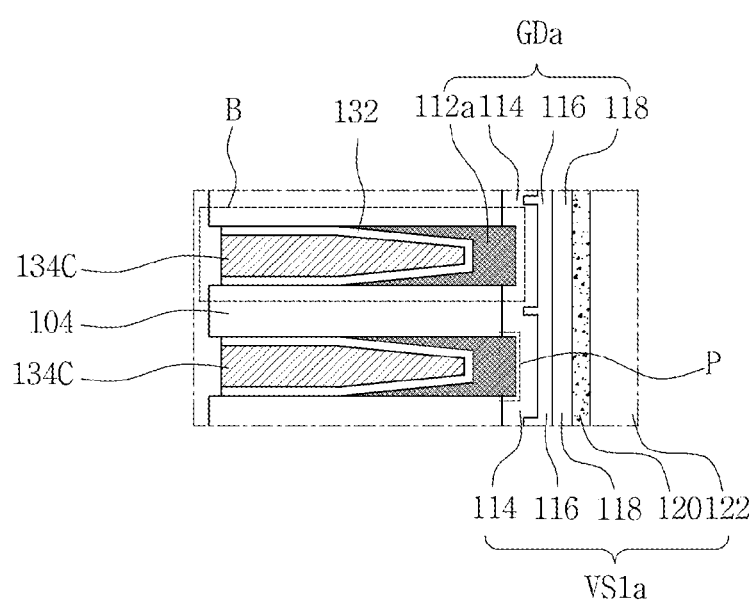
FIG. 1B illustrates an enlarged view of part A of FIG. 1A.
Figure 1C:
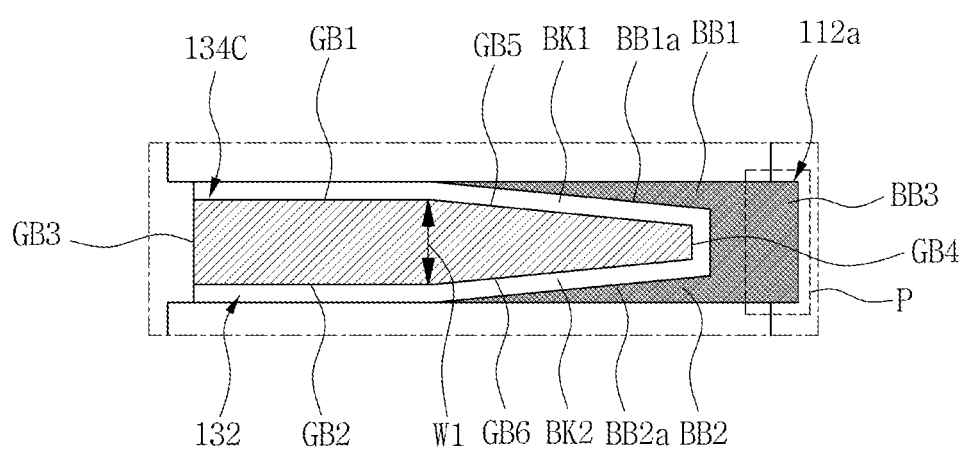
FIG. 1C illustrates an enlarged view of part B of FIG. 1B.

FIG. 1A illustrates a cross-sectional view showing a vertical cell-type semiconductor device according to example embodiments of inventive concepts. FIG. 1B illustrates an enlarged view of part A of FIG. 1A. FIG. 1C illustrates an enlarged view of part B of FIG. 1B.

Referring to FIGS. 1A and 1B, a vertical cell-type semiconductor device 100A according to example embodiments of inventive concepts may include a stacked structure 100S formed on a substrate 102, first to third capping layers 110, 126, and 128 covering the stacked structure 100S, a trench T passing through the first to third capping layers 110, 126, and 128 in vertical and horizontal directions, a through-hole H that is spaced apart from the trench T and passes through the stacked structure 100S and the first capping layer 110, first and second vertical structures VS1a and VS2 filling the through-hole H and the trench T respectively, a contact pad 124 disposed on a gap-fill pattern 122, a contact electrode 140 passing through the second and third capping layers 126 and 128 to be in contact with the contact pad 124, and a conductive interconnection 142 disposed on an upper surface of the third capping layer 128 in contact with the contact electrodes 140.

The stacked structure 100S may include interlayer insulating layers 104 and gate electrodes 134GS, 134C, and 134SS. The gate electrodes 134C may be alternately stacked with interlayer insulating layers 104 between the gate electrodes 134GS and 134SS. The gate electrode 134GS may be on a lowermost one of the interlayer insulating layers 104. An uppermost one of the interlayer insulating layers 104 may be on the gate electrode 134SS. The interlayer insulating layers 104 may include silicon oxide ($SiO_2$), and the gate electrodes 134GS, 134C, and 134SS may include a conductive material, such as tungsten (W), copper (Cu), aluminum (Al), titanium (Ti), titanium nitride (TiN), tantalum (Ta), or doped silicon (n- or p-type Si).

The first vertical structure VS1a may include a gate dielectric layer GDa formed along an inner wall of the through-hole H, a cylindrical channel pattern 120 formed along an inner wall of the gate dielectric layer GDa, and a gap-fill pattern 122 formed in the center of the through-hole H so as to fill the interior of the channel pattern 120. The channel pattern 120 may enclose an outer surface of the gap-fill pattern 122, and the gate dielectric layer GDa may enclose an outer surface of the channel pattern 120. An upper surface of the gap-fill pattern 122 may be located lower than an upper end of the through-hole H. Since the through-hole H may be circular when viewed in a plan view, the first vertical structure VS1a may look to be symmetrically formed on the inner wall of the through-hole H when viewed in a longitudinal sectional view.

A lower portion of the channel pattern 120 may be in contact with a surface of the substrate 102 and the surface of the substrate 102 may be a bottom surface of the through-hole H. An upper portion of the channel pattern 120 may be in contact with an entire outer surface of the contact pad 124. The channel pattern 120 may include a semiconductor material, such as single crystalline silicon or poly-crystalline silicon.

The substrate 102 may include a semiconductor substrate, such as a silicon (Si) substrate, a silicon germanium (SiGe) substrate, or a semiconductor-on-insulator (SOI) substrate. For example, the semiconductor-on-insulator (SOI) substrate may be a silicon-on-insulator substrate.

The contact pad 124 may include a conductive or semiconductor material, such as single crystalline silicon or poly-crystalline silicon. The first to third capping layers 110, 126, and 128 may include an insulating material, such as silicon oxide. The contact electrode 140 and the conductive interconnection 142 may include a conductive material, such as copper (Cu), tungsten (W), or aluminum (Al).

Among the plurality of gate electrodes 134GS, 134C, and 134SS, the lowermost gate electrode 134GS may be used as a ground selection gate electrode 134GS, and the uppermost gate electrode 134SS may be used as a string selection gate electrode 134SS. Gate electrodes 134C formed between the ground selection gate electrode 134GS and the string selection gate electrode 134SS may be used as cell gate electrodes 134C. Thus, the ground selection gate electrode 134GS, the gate dielectric layer GDa that is in contact with the ground selection gate electrode 134GS, and the channel pattern 120 may constitute a ground selection transistor. The cell gate electrodes 134C, the gate dielectric layer GDa that is in contact with the cell gate electrodes 134C, and the channel pattern 120 may constitute cell transistors. The string selection gate electrode 134SS, the gate dielectric layer GDa that is in contact with the string selection gate electrode 134SS, and the channel pattern 120 may constitute a string selection transistor. In this way, the ground selection transistor, the numerous cell transistors, and the string selection transistor may form a unit vertical cell string. The conductive interconnection 142 may be used as a bit line.

The second vertical structure VS2 may have the shape of a fence filling the trench T. The second vertical structure VS2 may include silicon oxide.

Further referring FIGS. 1B and 1C, the gate electrodes 134GS, 134C, and 134SS of the vertical cell-type semiconductor device 100A according to example embodiments of inventive concepts may each include an upper surface GB1, a lower surface GB2, a first lateral surface GB3, a second lateral surface GB4, an upper inclined surface GB5 between the upper surface GB1 and the first lateral surface GB4, and a lower inclined surface GB6 between the lower surface GB2 and the second lateral surface GB4. A vertical length of the second lateral surface GB4 may be shorter than that of the first lateral surface GB3. The gate electrodes 134GS, 134C, and 134SS may have a shape in which a vertical width W1 is reduced with the approach to the second lateral surface GB4.

The gate dielectric layer GDa may include protective patterns 112a, each of which partly encloses each of the gate electrodes 134GS, 134C, and 134SS, a barrier layer 114 that is in contact with exposed lateral surfaces of the protective patterns 112a and the interlayer insulating layers 104, a charge trap layer 116 that is in contact with the barrier layer 114, and a tunneling layer 118 that have one surface of which is in contact with the charge trap layer 116, and the other surface of which is in contact with the channel pattern 120. Further, the gate dielectric layer GDa may further include blocking layers 132 disposed among the gate electrodes 134GS, 134C, and 134SS, the protective patterns 112a, and the interlayer insulating layers 104.

The blocking layers 132 may each enclose the upper surface GB1, the lower surface GB2, the first lateral surface GB3, the second lateral surface GB4, the upper inclined surface GB5, and the lower inclined surface GB6 of each of the gate electrodes 134GS, 134C, and 134SS. Thus, the blocking layers 132 may each include an upper inclined part BK1 and a lower inclined part BK2 enclosing the upper inclined surface GB5 and the lower inclined surface GB6 of each of the gate electrodes 134GS, 134C, and 134SS.

The protective patterns 112a may include upper parts BB1 partly enclosing the upper inclined surfaces GB5 of the gate electrodes 134GS, 134C, and 134SS and/or the upper inclined parts BK1 of the blocking layers 132, lower parts BB2 enclosing the lower inclined surface GB6 of the gate electrodes 134GS, 134C, and 134SS and/or the lower inclined parts BK2 of the blocking layers 132, and body parts BB3 enclosing the second lateral surfaces GB4 of the gate electrodes 134GS, 134C, and 134SS and/or the lateral surfaces of the blocking layers 132. The upper part BB1 of each protective pattern 112a may have an inclined inner surface BB1a that is in contact with the upper inclined part BK1 of each blocking layer 132. The lower part BB2 of each protective pattern 112a may have an inclined inner surface BB2a that is in contact with the lower inclined part BK2 of each blocking layer 132.

Each protective pattern 112a may include oxidized silicon more compact (e.g., higher density) than oxide included in the interlayer insulating layer 104 and barrier layer 114. A process of forming the protective patterns 112a may include a radical oxidation process.

A lateral profile of the barrier layer 114 may protrude or be recessed along profiles of the protective patterns 112a. That is, the barrier layer 114 may be in contact with portions P, each of which protrudes into the through-hole H in the body part BB3 of each protective pattern 112a, and one lateral surface of each interlayer insulating layer 104. The barrier layer 114 may include (deposited) silicon oxide.

In some cases, the barrier layer 114 may be omitted.

The charge trap layer 116 may be in contact with the barrier layer 114. The charge trap layer 116 is an information storage layer that functions to trap and hold electric charges implanted from the channel pattern 120 through the tunneling layer 118, or to eliminate the electric charges trapped in the tunneling layer 118. A material of which the charge trap layer 116 is formed may include silicon nitride ($SiN_x$), aluminum oxide ($Al_2O_3$), zirconium oxide (ZrO), hafnium oxide (HfO), or lanthanum oxide (LaO), (e.g., a material having a higher dielectric constant compared to silicon oxide.

The tunneling layer 118 is a passage through which the electrons introduced from the channel pattern 120 move to the charge trap layer 116. The tunneling layer 118 may include silicon oxide or nitrogen-doped silicon oxide.

Each blocking layer 132 limits (and/or prevents) the electric charges stored in the charge trap layer 116 from being tunneled to each cell gate electrode 134C, and thereby can improve information storage capability. Each blocking layer 132 may be in contact with an upper and/or lower surface of each interlayer insulating layer 104. Each blocking layer 132 may include an insulating material having a high work function (and/or dielectric constant), such as aluminum oxide ($Al_2O_3$) or hafnium oxide ($HfO_2$).

The vertical cell-type semiconductor device 100A according to example embodiments of inventive concepts includes the barrier layer 114 between the gate electrodes 134GS, 134C, and 134SS and the charge trap layer 116, and the protective patterns 112a more compact than the barrier layer 114, and thereby can limit (and/or prevent) the charge trap layer 116 and the channel pattern 120 from being damaged by an etchant.

Further, since each of the gate electrodes 134GS, 134C, and 134SS has a shape in which the vertical width W1 thereof is reduced with the approach to one end thereof at an arbitrary position by each protective pattern 112a, no or a (reduced and/or minimum amount of) voids or seams can be present in the gate electrodes 134GS, 134C, and 134SS.

Figure 2A:
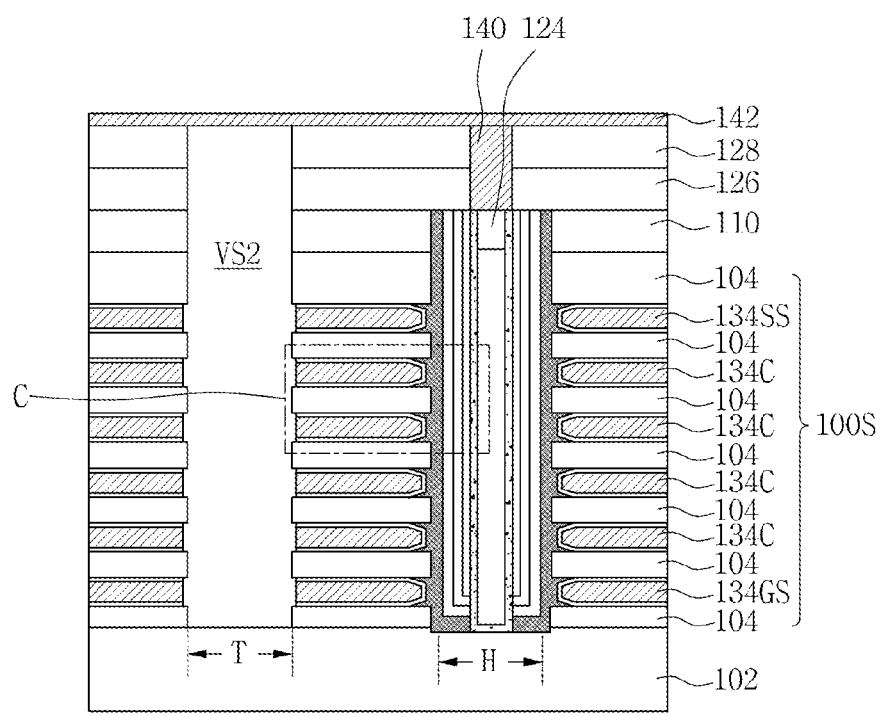
FIG. 2A illustrates a cross-sectional view showing a vertical cell-type semiconductor device according to example embodiments of inventive concepts.
Figure 2B:
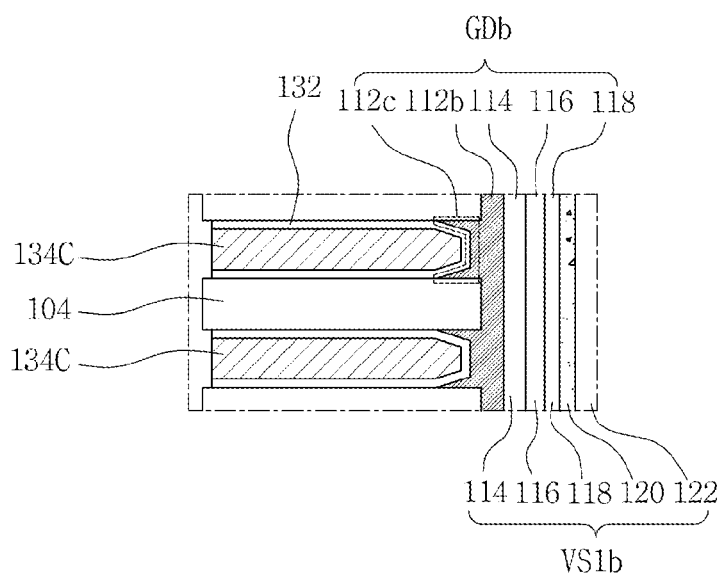
FIG. 2B illustrates an enlarged view of part C of FIG. 2A.

FIG. 2A illustrates a cross-sectional view showing a vertical cell-type semiconductor device according to example embodiments of inventive concepts. FIG. 2B illustrates an enlarged view of part C of FIG. 2A.

Referring to FIGS. 2A, 2B, and 1C a vertical cell-type semiconductor device 100b according to example embodiments of inventive concepts may include a stacked structure 100S in which interlayer insulating layers 104 and gate electrodes 134GS, 134C, and 134SS are alternately and repeatedly stacked on a substrate 102, first to third capping layers 110, 126, and 128 covering the stacked structure 100S, a through-hole H passing through the stacked structure 100S and the first capping layer 110, a trench T passing through the stacked structure 100S and the first to third capping layers 110, 126, and 128, first and second vertical structures VS1b and VS2 filling the through-hole H and the trench T respectively, a contact pad 124 being in contact with the first vertical structure VS1b, a contact electrode 140 passing through the second and third capping layers 126 and 128 to be in contact with the contact pad 124, and a conductive interconnection 142 formed on an upper surface of the third capping layer 128 in contact with the contact electrode 140.

The first vertical structure VS1b may include a cylindrical gate dielectric layer GDb formed along an inner wall of the through-hole H, a channel pattern 120 formed along an inner wall of the gate dielectric layer GDb, and a gap-fill pattern 122 filling the interior of the channel pattern 120. The channel pattern 120 may be in contact with a surface of the substrate 102, which is a bottom surface of the through-hole H, and an entire outer surface of the contact pad 124.

The gate dielectric layer GDb may include a tunneling layer 118 enclosing the channel pattern 120, a charge trap layer 116 enclosing the tunneling layer 118, a barrier layer 114 enclosing the charge trap layer 116, a protective layer 112b surrounding the barrier layer 114, protective patterns 112c that are integrally formed with the protective layer 112b, extend toward the gate electrodes 134SS, 134C, and 134GS, and enclose one sides of the gate electrodes 134SS, 134C, and 134GS, and blocking layers 132 that are in contact with the protective patterns 112c and enclose the gate electrodes 134GS, 134C, and 134SS.

One surface of each blocking layer 132 may be in contact with an upper surface GB1, a lower surface GB2, a first lateral surface GB4, a second lateral surface GB5, and an upper inclined surface GB6 of each of the gate electrodes 134SS, 134C, and 134GS, and the other surface of each blocking layer 132 may be in contact with parts of upper and lower surfaces of each interlayer insulating layer 104 and an upper part BB1, a lower part BB2, and a body part BB3 of each protective pattern 112c.

The protective layer 112b and the protective patterns 112c may include oxidized silicon. The barrier layer 114 may include deposited silicon oxide. The oxidized silicon included in the protective layer 112b and the protective patterns 112c may be more compact than the deposited silicon oxide included in the barrier layer 114.

Since the protective layer 112b is present, the upper part BB1, the lower part BB2, an inclined upper inner surface BB1a, and an inclined lower inner surface BB2a of each protective pattern 112c that is in contact with the lower and upper surfaces of the interlayer insulating layer 104, may be formed at a short length. This configuration may mean that an area of the protective patterns 112c enclosing the gate electrodes 134SS, 134C, and 134GS within a desired (and/or alternatively predetermined) space can be reduced, compared to that of the semiconductor device 100A according to example embodiments.

Thus, as an area which the protective patterns 112c occupy within the desired (and/or alternatively predetermined) space is reduced, an area of the gate electrode 134SS, 134C, and 134GS can be increased as such. Nevertheless, since one side of each of the gate electrodes 134SS, 134C, and 134GS can be formed in a shape in which a vertical width thereof is reduced, voids and seams in the gate electrodes 134SS, 134C, and 134GS can be reduced (and/or minimized).

Figure 3A:
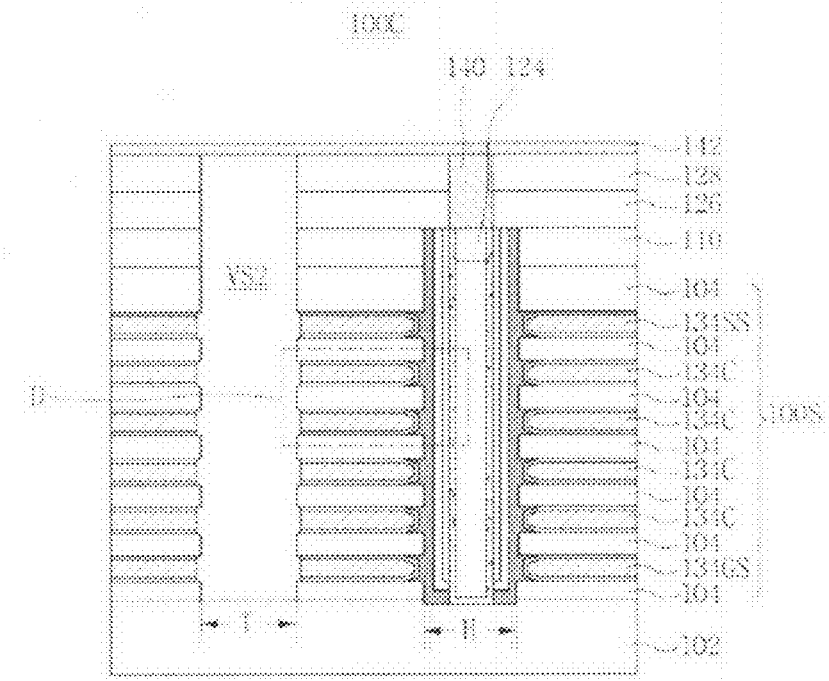
FIG. 3A illustrates a cross-sectional view showing a vertical cell-type semiconductor device according to example embodiments of inventive concepts.
Figure 3B:
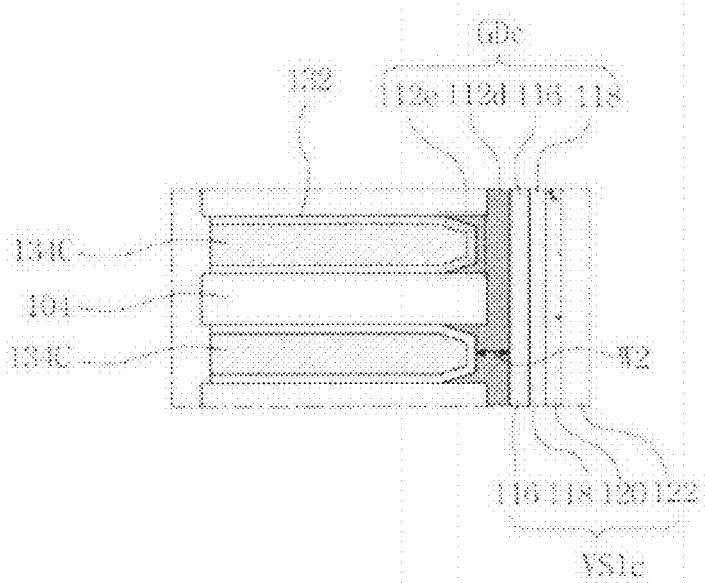
FIG. 3B illustrates an enlarged view of part D of FIG. 3A.

FIG. 3A illustrates a cross-sectional view showing a vertical cell-type semiconductor device according to example embodiments of inventive concepts. FIG. 3B illustrates an enlarged view of part D of FIG. 3A.

Referring to FIGS. 3A, 3B, and 1C, a vertical cell-type semiconductor device 100C according to example embodiments of inventive concepts may include a stacked structure 100S in which interlayer insulating layers 104 and gate electrodes 134GS, 134C, and 134SS are alternately and repeatedly stacked on a substrate 102, first to third capping layers 110, 126, and 128 covering the stacked structure 100S, a through-hole H passing through the stacked structure 100S and the first capping layer 110, a trench T passing through the stacked structure 100S and the first to third capping layers 110, 126, and 128, first and second vertical structures VS1c and VS2 filling the through-hole H and the trench T respectively, a contact pad 124 being in contact with the first vertical structure VS1c, a contact electrode 140 passing through the second and third capping layers 126 and 128 to be in contact with the contact pad 124, and a conductive interconnection 142 formed on an upper surface of the third capping layer 128 in contact with the contact electrode 140.

The first vertical structure VS1c may include a gate dielectric layer GDc formed along an inner wall of the through-hole H, a cylindrical channel pattern 120 formed along an inner wall of the gate dielectric layer GDc, and a gap-fill pattern 122 filling the interior of the channel pattern.

The gate dielectric layer GDc may include a tunneling layer 118 enclosing the channel pattern 120, a charge trap layer 116 enclosing the tunneling layer 118, a protective layer 112d enclosing the charge trap layer 116, protective patterns 112e that are integrally formed with the protective layer 112d, extend toward the gate electrodes 134SS, 134C, and 134GS, and enclose one sides of the gate electrodes 134SS, 134C, and 134GS, and blocking layers 132 that are located between the protective patterns 112e and the gate electrodes 134GS, 134C, and 134SS and enclose the gate electrodes 134SS, 134C, and 134GS. Each blocking layer 132 may enclose an upper surface, a lower surface, and one side of each of the gate electrodes 134SS, 134C, and 134GS.

The protective layer 112d and the protective patterns 112e may include oxidized silicon more compact than oxide included in the barrier layer 114.

Since the protective layer 112d is present, the time required for an oxidation process of forming the protective patterns 112e can be reduced compared to the semiconductor device 100A according to example embodiments. As such, an upper part BB1, a lower part BB2, an upper inner surface BB1a and a lower inner surface BB2a of each protective pattern 112e that is in contact with lower and upper surfaces of the interlayer insulating layer 104, may be formed at a short length. Thus, as described above, an area which the protective patterns 112e occupy is reduced, an area of the gate electrode 134SS, 134C, and 134GS can be increased as such. Nevertheless, since one side of each of the gate electrodes 134SS, 134C, and 134GS may be formed in a shape in which a vertical width thereof is reduced, voids and seams in the gate electrodes 134SS, 134C, and 134GS can be reduced (and/or minimized).

Further, since the protective patterns 112e and the protective layer 112d are formed between the gate electrodes 134GS, 134C, and 134SS and the charge trap layer 116, they can replace a function of the barrier layer 114 described above, and thus the barrier layer 114 can be omitted. In this case, a horizontal width W2 of the protective patterns 112e and the protective layer 112d may be formed so as to be somewhat wider.

Figure 4A:
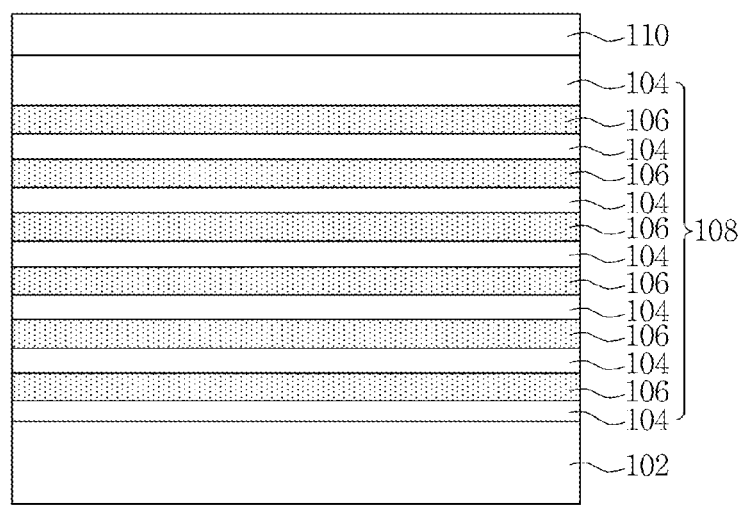
FIGS. 4A to 4Q illustrate process cross-sectional views showing a method of fabricating a vertical cell-type semiconductor device according to example embodiments of inventive concepts in a process sequence.
Figure 4B:
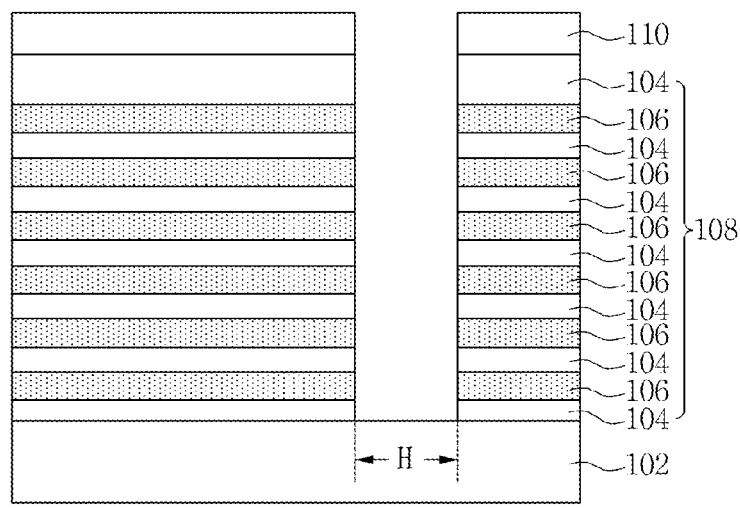
Figure 4C:
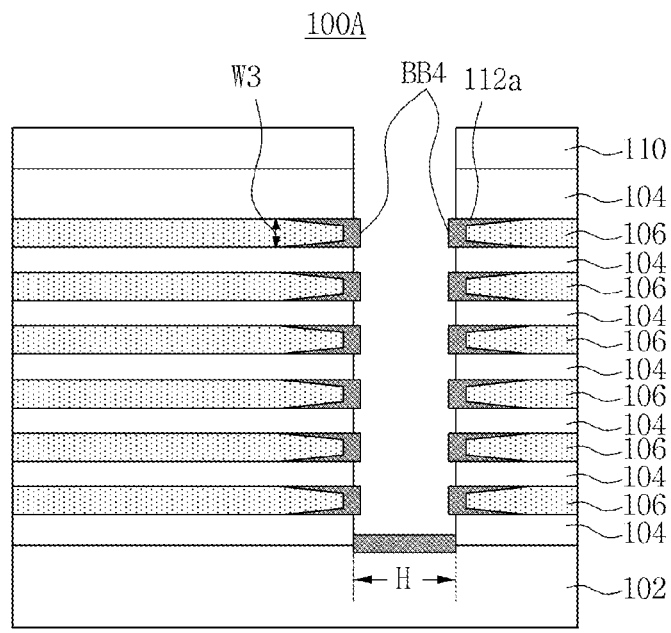
Figure 4D:
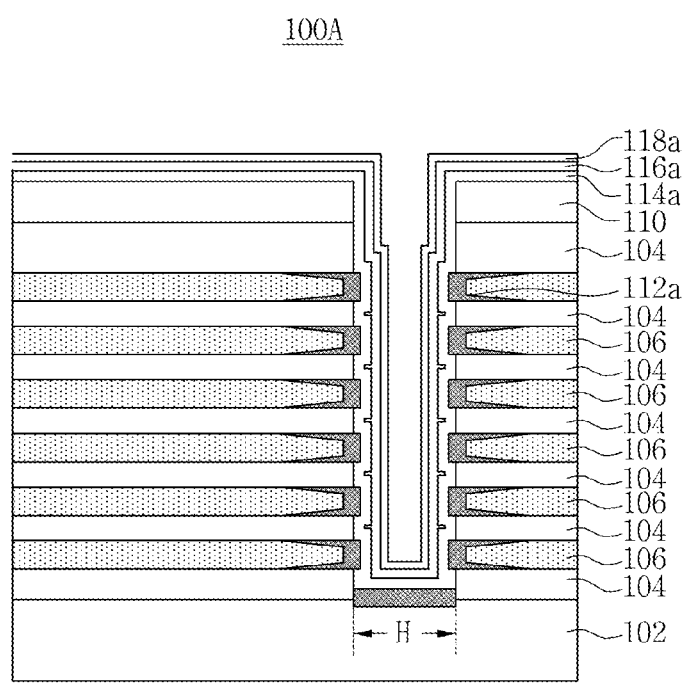
Figure 4E:
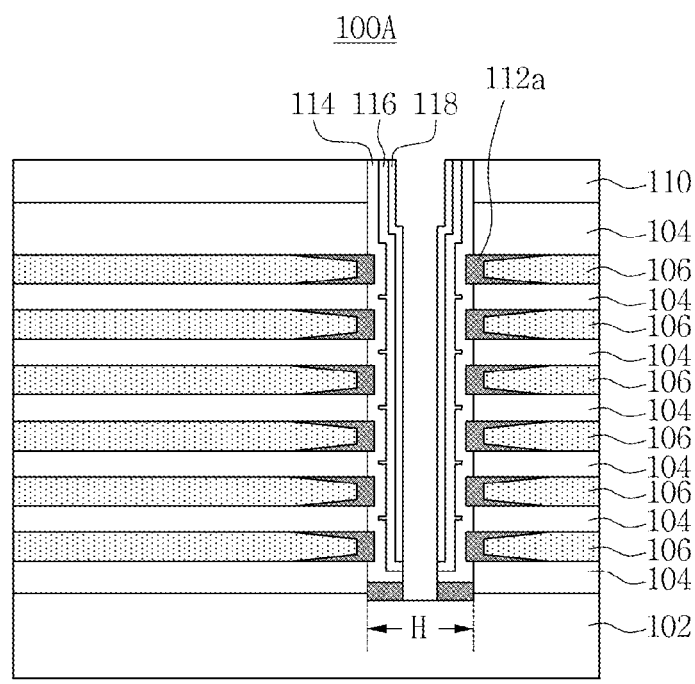
Figure 4F:
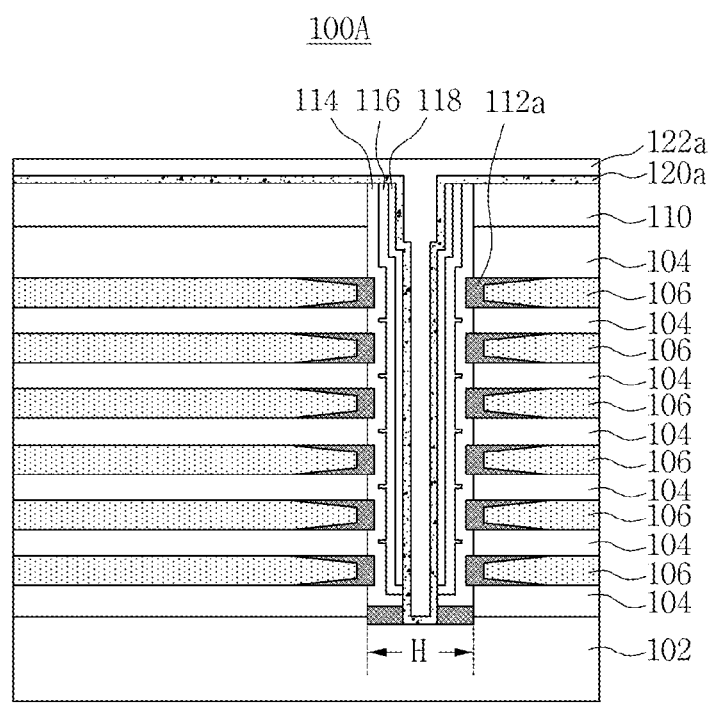
Figure 4G:
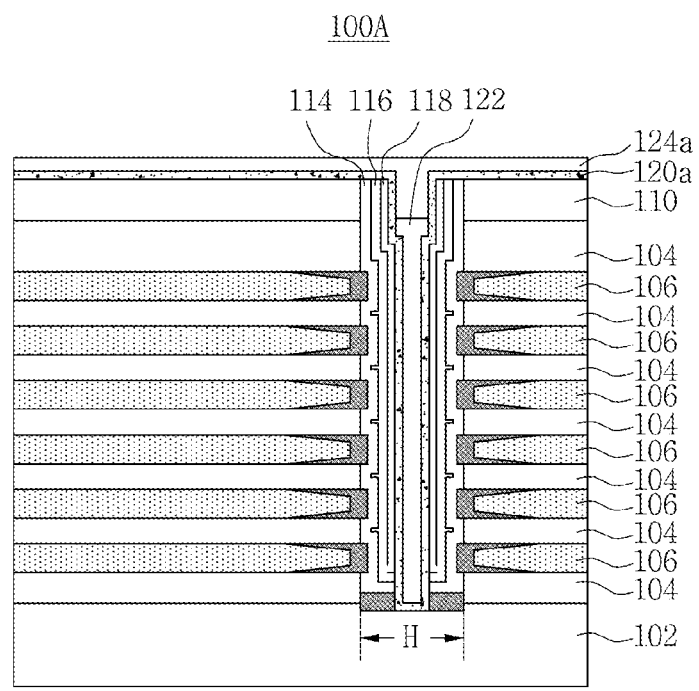
Figure 4H:
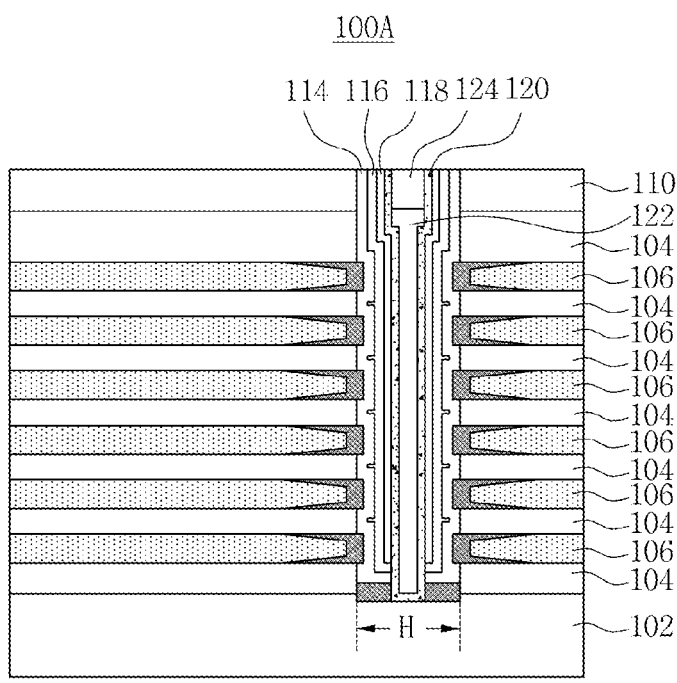
Figure 4I:
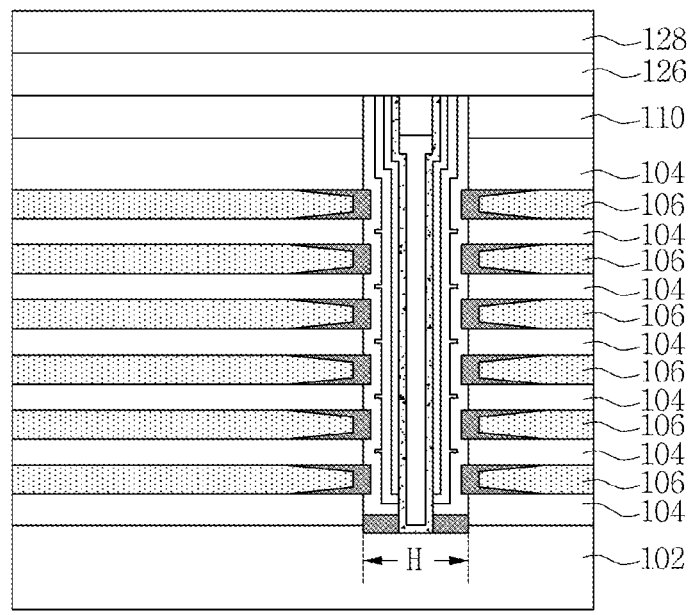
Figure 4J:
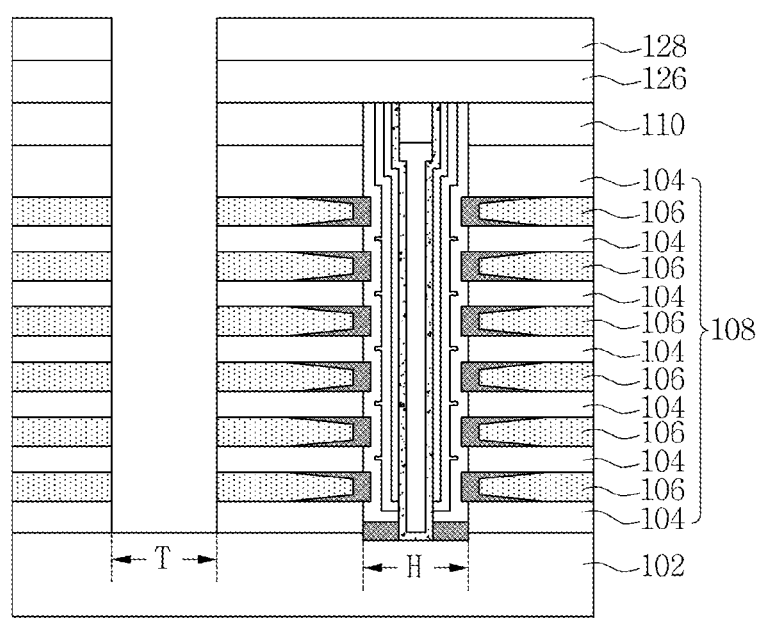
Figure 4K:
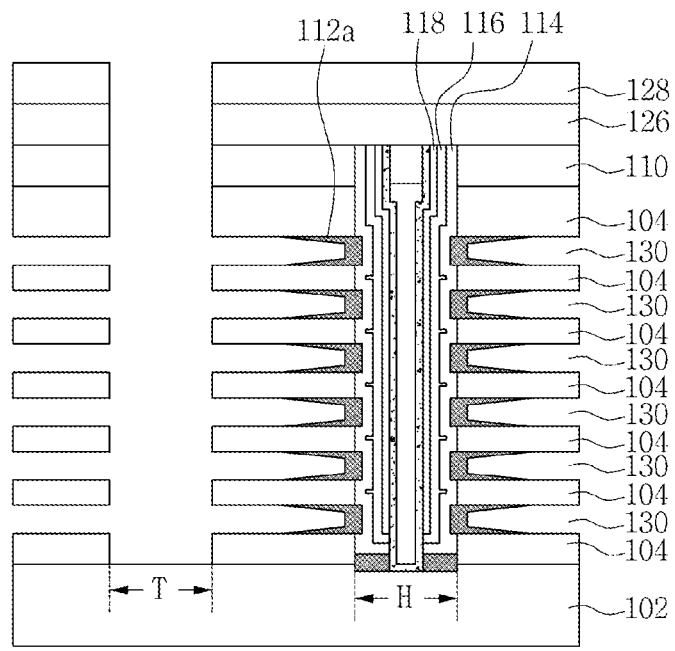
Figure 4L:
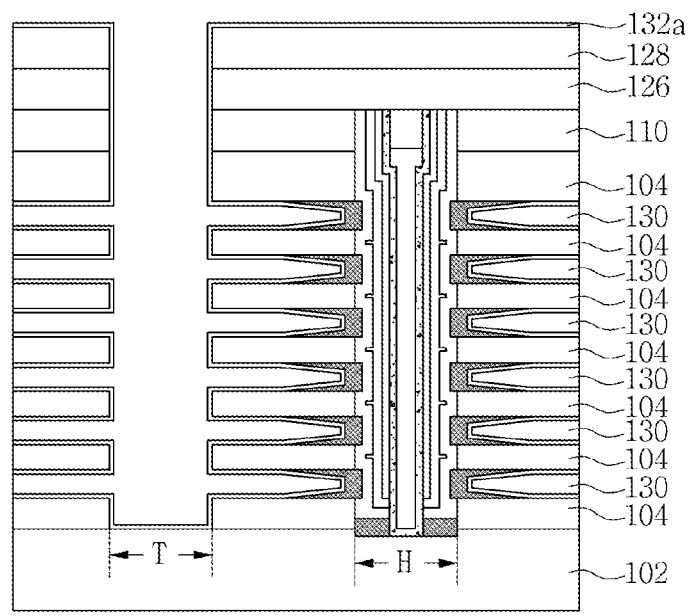
Figure 4M:
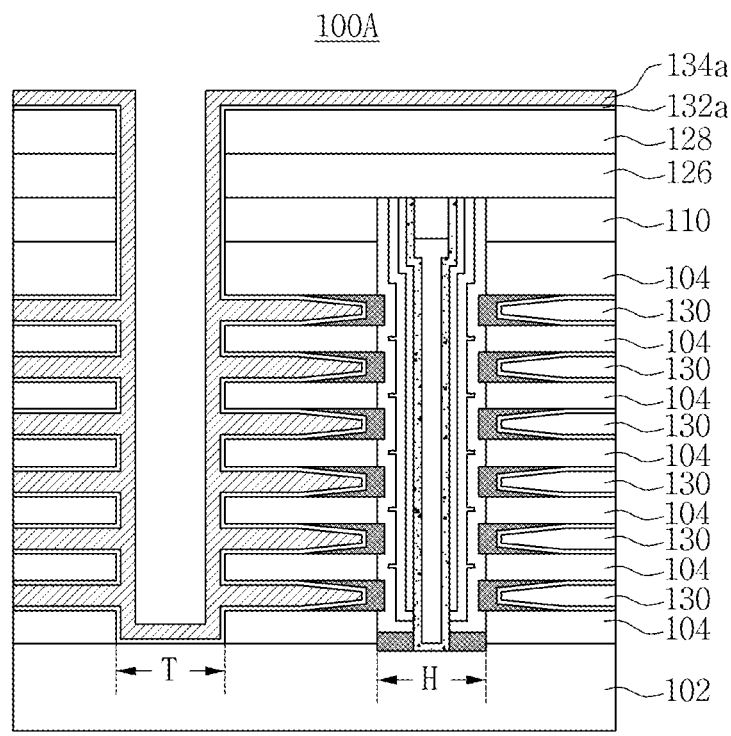
Figure 4N:
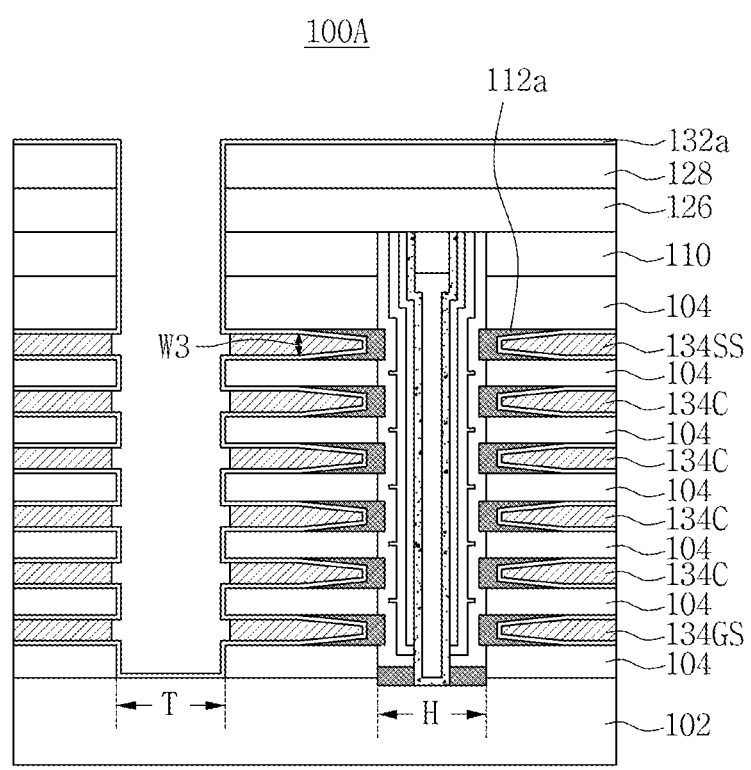
Figure 4O:
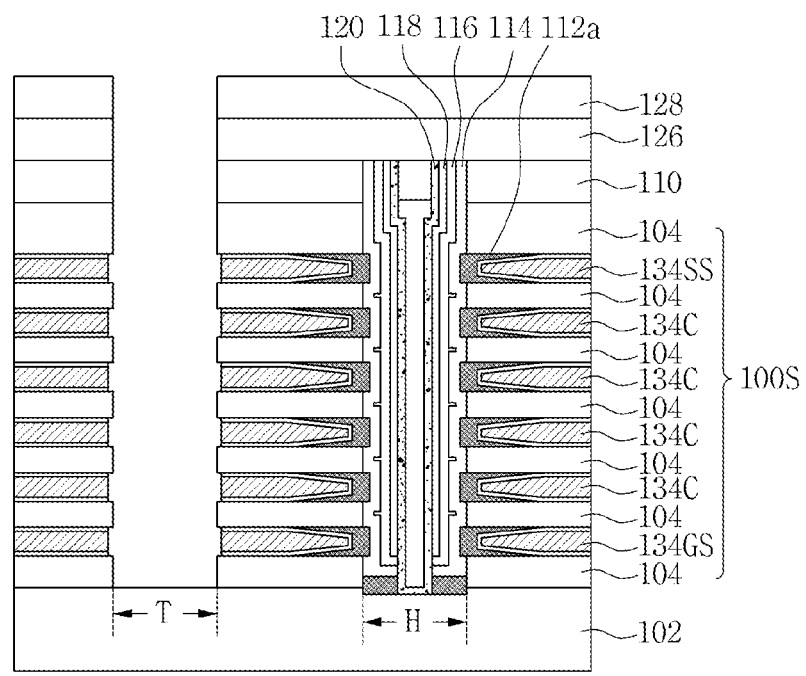
Figure 4P:
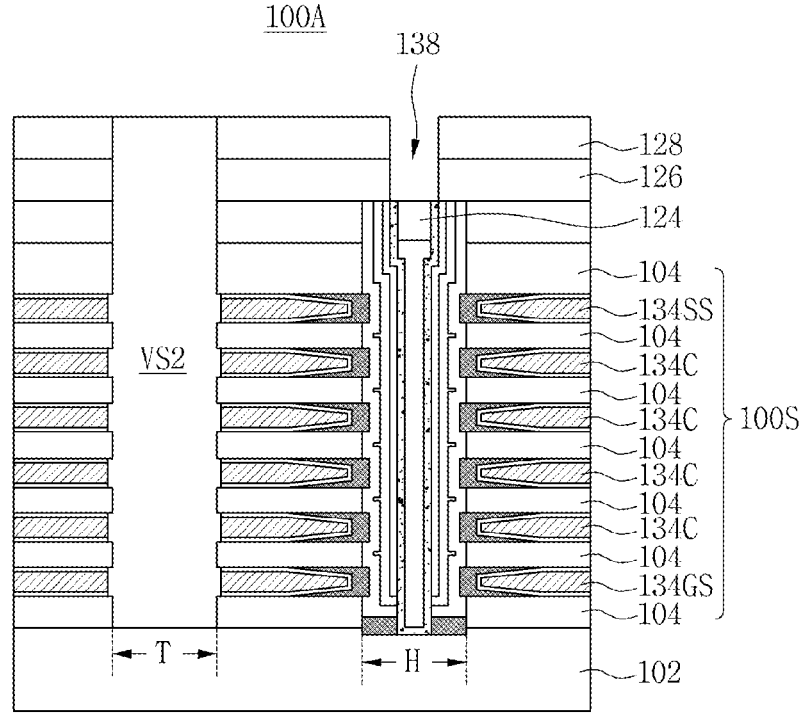
Figure 4Q:
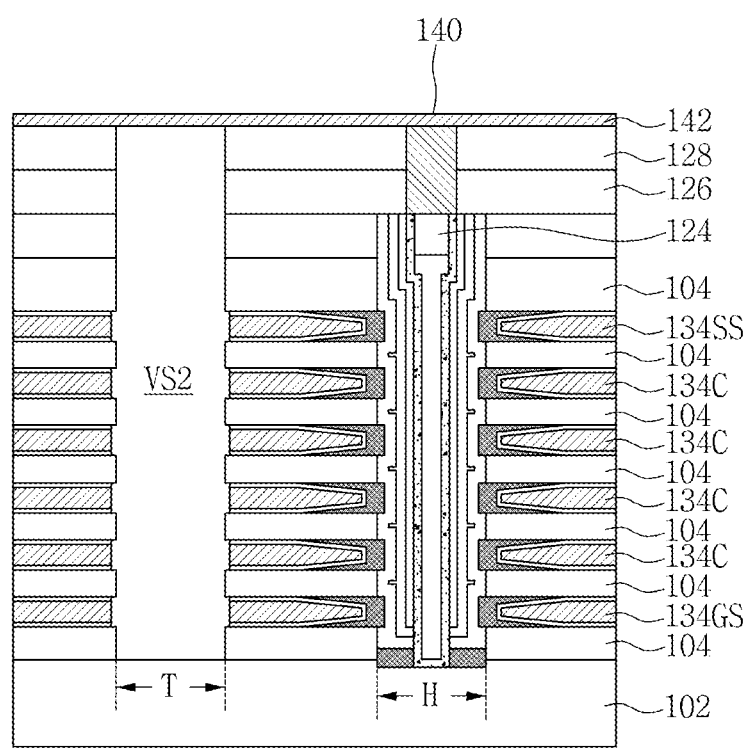

FIGS. 4A to 4Q illustrate process cross-sectional views showing a method of fabricating the vertical cell-type semiconductor device according to example embodiments of inventive concepts in a process sequence.

Referring to FIG. 4A, a method of fabricating the vertical cell-type semiconductor device 100A according to example embodiments of inventive concepts may include alternately stacking a plurality of interlayer insulating layers 104 and a plurality of sacrificial layers 106 on a substrate 102 to form a preliminary stacked structure 108, and stacking a first capping layer 110 on the preliminary stacked structure 108. The substrate 102 may be formed of a semiconductor material, and include, for instance, a silicon (Si) substrate, a silicon germanium (SiGe) substrate, or a silicon-on-insulator (SOI) substrate. The interlayer insulating layers 104 may include silicon oxide ($SiO_2$), and the sacrificial layers 106 may include silicon nitride (SiNx). Further, the first capping layer 110 may include silicon oxide ($SiO_2$).

Referring to FIG. 4B, the method of fabricating the vertical cell-type semiconductor device 100A according to example embodiments of inventive concepts may include forming a through-hole H vertically passing through the preliminary stacked structure 108 and the first capping layer 110. An inner wall of the through-hole H may be exposed lateral surfaces of the interlayer insulating layers 104 and the sacrificial layers 106. A surface of the substrate 102 may be a bottom surface of the through-hole H.

Referring to FIG. 4C, the method of fabricating the vertical cell-type semiconductor device 100A according to example embodiments of inventive concepts may include oxidizing the exposed sacrificial layers 106 to form protective patterns 112a. The oxidation reaction of the sacrificial layers 106 may proceed from the lateral surfaces exposed to the through-hole H. During the oxidation reaction, oxygen radicals may penetrate into surfaces of the sacrificial layers 106, and interfaces of the sacrificial layers 106 and the interlayer insulating layers 104. The oxygen radicals may penetrate along the interfaces of the sacrificial layers 106 and the interlayer insulating layers 104 deeper than the surfaces of the sacrificial layers 106. Thus, the protective patterns 112a may be shaped of an open square bracket ([) or a close square bracket (]). A thickness of each protective pattern 112a gets thinner and thinner in proportion to a distance from the through-hole H. In contrast, each sacrificial layer 106 may have a shape in which a vertical width W3 thereof is reduced in inverse proportion to the distance from the through-hole H. Each protective pattern 112a may be formed so as to enclose parts of upper and lower surfaces of each sacrificial layer 106, and a lateral surface of each sacrificial layer 106. Further, each protective pattern 112a may be in contact with parts of upper and lower surfaces of each interlayer insulating layer 104. One vertical surface BB4 of each protective pattern 112a may protrude toward the center of the through-hole H. Here, during the oxidation reaction, the exposed surface of the substrate 102, which is the bottom surface of the through-hole H, may also be subjected to the oxidation reaction.

The process of oxidizing the sacrificial layers 106 supplies the oxygen radicals to the exposed surfaces of the sacrificial layers 106. The oxidation process may include a radical oxidation process. The radical oxidation process may include an in-situ steam generation (ISSG) oxidation process and a plasma oxidation process. The ISSG oxidation process is a radical oxidation process using heat, and may use hydrogen ($H_2$) gas, oxygen ($O_2$) gas, or water vapor ($H_2O$) under low pressure at a high temperature of 800 to 1000° C. For example, oxygen radicals are penetrated into the sacrificial layers 106 and then coupled with silicon dangling bonds in the sacrificial layers 106, or an oxygen radical is penetrated with a strong force, cuts a nitrogen atom coupled to a silicon atom and then is coupled to the silicon atom, and thereby oxidized silicon may be formed. The plasma oxidation process is a radical oxidation process using plasma, and may use a mixture gas of argon (Ar), hydrogen, and oxygen gases, a mixture gas of argon and oxygen gases, a mixture gas of helium (He), hydrogen, and oxygen gases, a mixture gas of helium and oxygen gases, or a mixture gas of hydrogen and oxygen gases. The plasma oxidation process may proceed at a lower temperature compared to the ISSG oxidation process. In the plasma oxidation process, temperature and pressure conditions may be adjusted in order to enhance the penetration of the oxygen radicals. The oxide formed in the oxidation process has a more compact composition and a stronger bond than that formed in a deposition process, and thus is excellent in chemical and physical durability. For example, the oxide formed in the oxidation process may have more excellent etching resistance than that formed in the deposition process.

Referring to FIG. 4D, the method of fabricating the vertical cell-type semiconductor device 100A according to example embodiments of inventive concepts may include conformally forming a first dielectric layer 114a on the exposed lateral surfaces of the protective patterns 112a, interlayer insulating layers 104, and the first capping layer 110 in the through-hole H and on an upper surface of the first capping layer 110, conformally forming a second dielectric layer 116a on an upper surface of the first dielectric layer 114a, and conformally forming a third dielectric layer 118a on an upper surface of the second dielectric layer 116a. The first dielectric layer 114a may include silicon oxide, and the second dielectric layer 116a may include silicon nitride (SiNx). Further, the third dielectric layer 118a may include silicon oxide or nitrogen-doped silicon oxide.

Referring to FIG. 4E, the method of fabricating the vertical cell-type semiconductor device 100A according to example embodiments of inventive concepts may include forming a barrier layer 114, a charge trap layer 116, and a tunneling layer 118 in the through-hole H. The process of forming the barrier layer 114, the charge trap layer 116, and the tunneling layer 118 may include performing an etch-back process on the first to third dielectric layers 114a, 116a, and 118a to remove the third, second, and first dielectric layers 118a, 116a, and 114a on the first capping layer 110. The first to third dielectric layers 114a, 116a, and 118a formed on the first capping layer 110 may be removed by an overall anisotropic etching process (the etch back process), and thereby the barrier layer 114 that are in contact with the vertical lateral surfaces of the interlayer insulating layers 104, the charge trap layer 116 and the tunneling layer 118, may be formed. Further, during the etching process, the upper surface of the substrate 102 may be exposed at the bottom of the through-hole H.

Referring to FIG. 4F, the method of fabricating the vertical cell-type semiconductor device 100A according to example embodiments of inventive concepts may include forming a channel layer 120a along the upper surface of the substrate 102 which is exposed at the bottom of the through-hole H, a surface of the tunneling layer 118, and lateral and upper surfaces of the first capping layer 110, and forming a gap-fill layer 122a on a surface of the channel layer 120a so as to fill the interior of the through-hole H. The process of forming the channel layer 120a may include a chemical vapor deposition (CVD) process, such as an atomic layer deposition (ALD) process. The channel layer 120a may be formed in a polycrystalline state by continuous heat treatment. Thus, the channel layer 120a may include polysilicon. The gap-fill layer 122a may include an insulating material, such as silicon oxide.

Referring to FIG. 4G, the method of fabricating the vertical cell-type semiconductor device 100A according to example embodiments of inventive concepts may include forming a gap-fill pattern 122 filling part of the through-hole H, and forming a contact layer 124a on upper surfaces of the gap-fill pattern 122 and the channel layer 120a. The process of forming the gap-fill pattern 122 may include removing a part of the gap-fill layer 122a using an etch-back process so as to remain only in the through-hole H. A surface of the gap-fill pattern 122 may be located lower than that of the first capping layer 110. The contact layer 124a may include polysilicon.

Referring to FIG. 4H, the method of fabricating the vertical cell-type semiconductor device 100A according to example embodiments of inventive concepts may include forming a contact pad 124 and a channel pattern 120 in the through-hole H. The process of forming the contact pad 124 and the channel pattern 120 may include a planarization process of partly removing the contact layer 124a and the channel layer 120a to expose the upper surface of the first capping layer 110, for instance a chemical mechanical polishing (CMP) process.

Referring to FIG. 4I, the method of fabricating the vertical cell-type semiconductor device 100A according to example embodiments of inventive concepts may include forming a second capping layer 126 and a third capping layer 128 on the through-hole H and the first capping layer 110. The second and third capping layers 126 and 128 may have an etch selectivity with respect to the sacrificial layers 106. For example, if the sacrificial layers 106 are formed of silicon nitride, the second and third capping layers 126 and 128 may include silicon oxide.

Referring to FIG. 4J, the method of fabricating the vertical cell-type semiconductor device 100A according to example embodiments of inventive concepts may include forming a trench T, which passes through the first to third capping layers 110, 126, and 128, and the preliminary stacked structure 108, at a position spaced apart from the through-hole H.

Referring to FIG. 4K, the method of fabricating the vertical cell-type semiconductor device 100A according to example embodiments of inventive concepts may include removing the sacrificial layers 106 located between the interlayer insulating layers 104 in the trench T to form interlayer spaces 130. As an etchant for removing the sacrificial layers 106, phosphoric acid ($H_3PO_4$) may be used. After the sacrificial layers 106 are removed using the phosphoric acid, a cleaning process using standard clean 1 (SC-1) may further proceed. Here, in the process of removing the sacrificial layers 106 using the phosphoric acid ($H_3PO_4$), the protective patterns 112a may be exposed. The protective patterns 112a can limit (and/or prevent) the phosphoric acid ($H_3PO_4$) from penetrating the interior of the through-hole H to cause damage to the barrier layer 114 and the charge trap layer 116.

Referring to FIG. 4L, the method of fabricating the vertical cell-type semiconductor device 100A according to example embodiments of inventive concepts may include conformally forming a fourth dielectric layer 132a on the exposed surfaces of the interlayer insulating layers 104 and the first to third capping layers 110, 126, and 128 which are exposed to the trench T. The fourth dielectric layer 132a may include aluminum oxide ($Al_2O_3$) or hafnium oxide (HfO).

Referring to FIG. 4M, the method of fabricating the vertical cell-type semiconductor device 100A according to example embodiments of inventive concepts may include forming a conductive layer 134a on the fourth dielectric layer 132a. The conductive layer 134a may be formed so as to fill the interlayer spaces 130 (see FIG. 4L). A material of which the conductive layer 134a is formed may include a doped semiconductor such as doped silicon, a metal such as tungsten (W), copper (Cu), or aluminum (Al), conductive metal nitride such as titanium nitride (TiN) or tantalum nitride (TaN), a conductive metal-semiconductor compound such as metal silicide, or transition metal such as titanium (Ti) or tantalum (Ta). For example, the conductive layer 134a may include tungsten (W) or titanium nitride (TiN).

Referring to FIG. 4N, the method of fabricating the vertical cell-type semiconductor device 100A according to example embodiments of inventive concepts may include partly removing the conductive layer 134a to form a plurality of gate electrodes 134SS, 134C, and 134GS. The gate electrodes 134SS, 134C, and 134GS may include a ground selection gate electrode 134GS located at a lowermost side so as to be adjacent to the substrate 102, a string selection gate electrode 134SS located at an uppermost side, and cell gate electrodes 134C located between the ground selection gate electrode 134GS and the string selection gate electrode 134SS. Here, the number of cell gate electrodes 134C may be $2^n$ (n is the natural number). The gate electrodes 134SS, 134C, and 134GS may each be formed in a shape in which a vertical width thereof is reduced with the approach to the through-hole H.

Referring to FIGS. 4O and 1C, the method of fabricating the vertical cell-type semiconductor device 100A according to example embodiments of inventive concepts may include partly removing the fourth dielectric layer 132a to form blocking layers 132 enclosing the gate electrodes 134GS, 134C, and 134SS. One surface of each blocking layer 132 may be in contact with an upper surface GB1, a lower surface GB2, an upper inclined surface GB5, a lower inclined surface GB6, and a second lateral surface GB4 of each of the gate electrodes 134GS, 134C, and 134SS, and the other surface of each blocking layer 132 may be in contact with parts of the upper and lower surfaces of the interlayer insulating layer 104 and the protective patterns 112a.

Referring to FIG. 4P, the method of fabricating the vertical cell-type semiconductor device 100A according to example embodiments of inventive concepts may include forming a second vertical structure VS2 in the trench T, and forming a via 138 exposing the contact pad 124. The second vertical structure VS2 may include silicon oxide ($SiO_2$).

Referring to FIG. 4Q, the method of fabricating the vertical cell-type semiconductor device 100A according to example embodiments of inventive concepts may include forming a contact electrode 140 that fills the via 138 and is in contact with the contact pad 124, and forming a conductive interconnection 142 extending along an upper surface of the third capping layer 128 in contact with the contact electrode 140. The contact electrode 140 and the conductive interconnection 142 may include a conductive material, such as copper (Cu), tungsten (W), or aluminum (Al).

FIGS. 5A to 5F illustrate process cross-sectional views showing a method of fabricating the vertical cell-type semiconductor device according to example embodiments of inventive concepts in a process sequence.

Figure 5A:
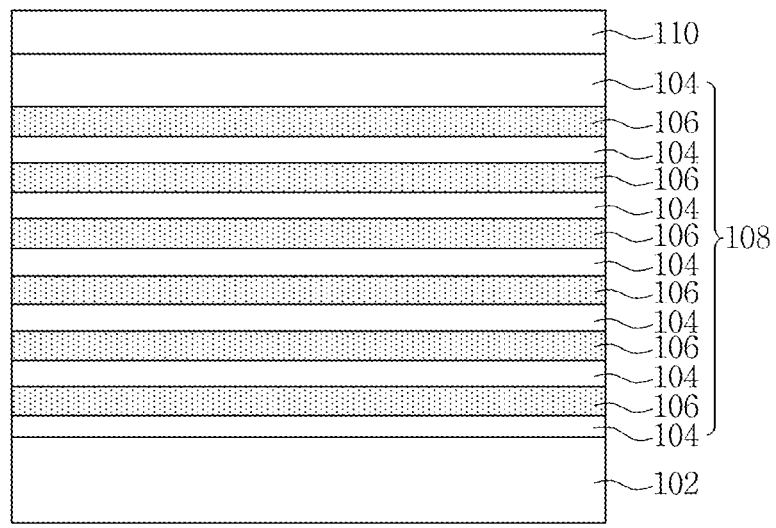
FIGS. 5A to 5F illustrate process cross-sectional views showing a method of fabricating a vertical cell-type semiconductor device according to example embodiments of inventive concepts in a process sequence.

Referring to FIG. 5A, a method of fabricating the vertical cell-type semiconductor device 100B according to example embodiments of inventive concepts may include alternately stacking a plurality of interlayer insulating layers 104 and a plurality of sacrificial layers 106 on a substrate 102 to form a preliminary stacked structure 108, and forming a first capping layer 110 on the preliminary stacked structure 108 The interlayer insulating layers 104 may include silicon oxide, and the sacrificial layers 106 may include silicon nitride.

Figure 5B:
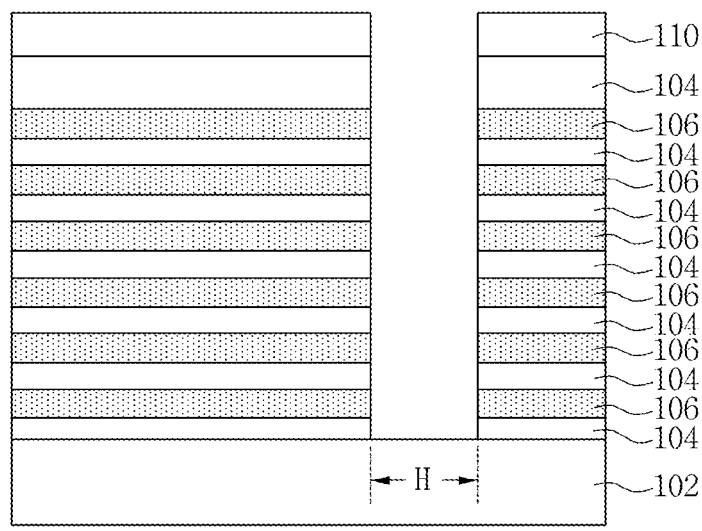

Referring to FIG. 5B, the method of fabricating the vertical cell-type semiconductor device 100B according to example embodiments of inventive concepts may include forming a through-hole H vertically passing through the first capping layer 110 and the preliminary stacked structure 108. An inner wall of the through-hole H may correspond to exposed lateral surfaces of the interlayer insulating layers 104 and the sacrificial layers 106. The surface of the substrate 102 may be a bottom surface of the through-hole H.

Figure 5C:
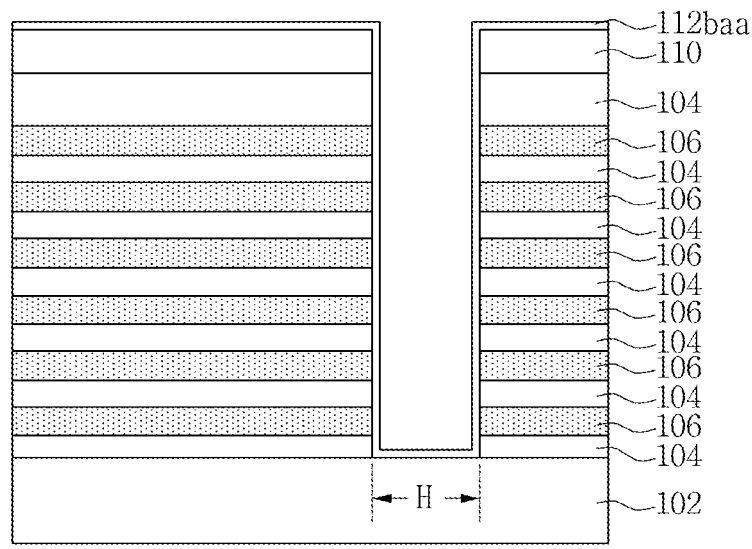

Referring to FIG. 5C, the method of fabricating the vertical cell-type semiconductor device 100B according to example embodiments of inventive concepts may include forming a first dielectric layer 112baa on the inner wall of the through-hole H. The first dielectric layer 112baa may include silicon nitride ($SiN_x$).

Figure 5D:
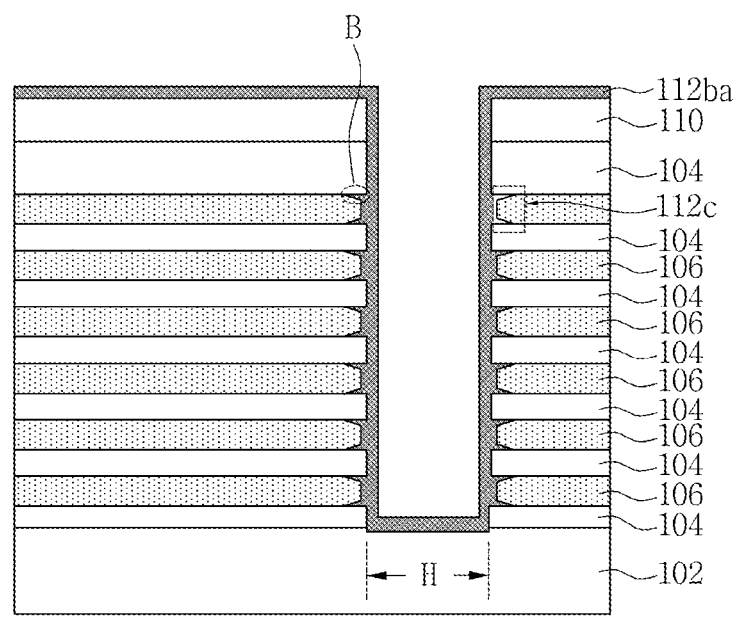

Referring to FIG. 5D, the method of fabricating the vertical cell-type semiconductor device 100B according to example embodiments of inventive concepts may include oxidizing the first dielectric layer 112*baa* and a part of each sacrificial layer 106 to form an oxide layer 112*ba*, and forming protective patterns 112*c*, each of which extends from the oxide layer and encloses a part of each sacrificial layer 106. Here, the process of oxidizing the first dielectric layer 112*baa* and the sacrificial layers 106 may include causing oxygen radicals to penetrate the first dielectric layer 112*baa* and the sacrificial layers 106 to react with silicon atoms. The oxidation reaction begins from a surface of the first dielectric layer 112*baa* to proceed to a part of each sacrificial layer 106.

In comparison with the semiconductor device 100A as described above, each protective pattern 112*c* formed by oxidizing a part of each sacrificial layer 106, may be formed at a short length E at which it is in contact with lower and upper surfaces of each interlayer insulating layer 104. This is because the oxide layer 112*ba* blocks or screens the oxygen radicals penetrating into an interface between the interlayer insulating layer 104 and each sacrificial layer 106. Thus, depending on the thickness of the first dielectric layer 112*baa*, a thickness of the oxide layer 112*ba* and a profile of each protective pattern 112*c* may be adjusted.

Figure 5E:
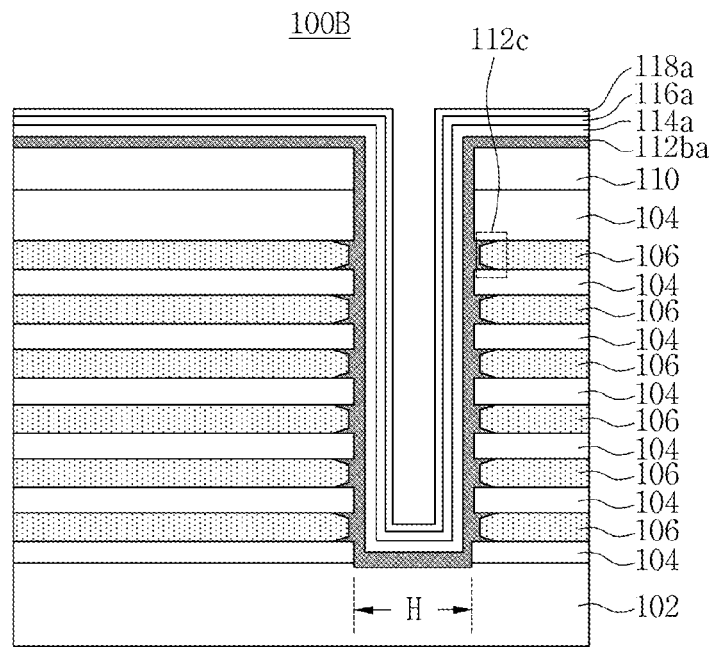

Referring to FIG. 5E, the method of fabricating the vertical cell-type semiconductor device 100B according to example embodiments of inventive concepts may include conformally forming a second dielectric layer 114*a* on the exposed surface of the oxide layer 112*ba*, conformally forming a third dielectric layer 116*a* on the second dielectric layer 114*a*, and conformally forming a fourth dielectric layer 118*a* on the third dielectric layer 116*a*. The second dielectric layer 114*a* may include silicon oxide, and the third dielectric layer 116*a* may include silicon nitride. Further, the fourth dielectric layer 118*a* may include silicon oxide or nitrogen-doped silicon nitride.

Figure 5F:
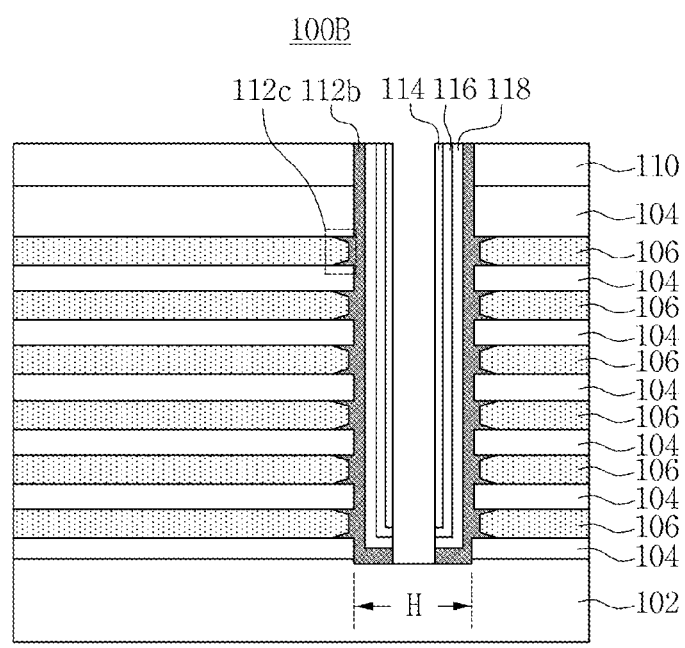

Referring to FIG. 5F, the method of fabricating the vertical cell-type semiconductor device 100B according to example embodiments of inventive concepts may include forming a protective layer 112*b*, a barrier layer 114, a charge trap layer 116, and a tunneling layer 118 in the through-hole H. The process of forming the protective layer 112*b*, the barrier layer 114, the charge trap layer 116, and the tunneling layer 118 may include an overall anisotropic etching process of partly removing the oxide layer 112*ba* and the second to fourth dielectric layers 114*a*, 116*a*, and 118*a* so that the oxide layer 112*ba* and the second to fourth dielectric layers 114*a*, 116*a*, and 118*a* are left only on the inner wall of the through-hole H. Due to the overall anisotropic etching process, the oxide layer 112*ba* may be etched to form the protective layer 112*b* that is in contact with the inner wall of the through-hole H, and the second dielectric layer 114*a* may be etched to form the barrier layer 114 that is in contact with the protective layer 112*b*. Further, the third dielectric layer 116*a* may be etched to form the charge trap layer 116 that is in contact with the barrier layer 114, and the fourth dielectric layer 118*a* may be etched to form the tunneling layer 118 that is in contact with the charge trap layer 116. The following processes are equal to those described with reference to FIGS. 4F to 4Q, and description thereof will be omitted.

FIGS. 6A to 6D illustrate process cross-sectional views showing a method of fabricating a vertical cell-type semiconductor device according to example embodiments of inventive concepts in a process sequence.

Figure 6A:
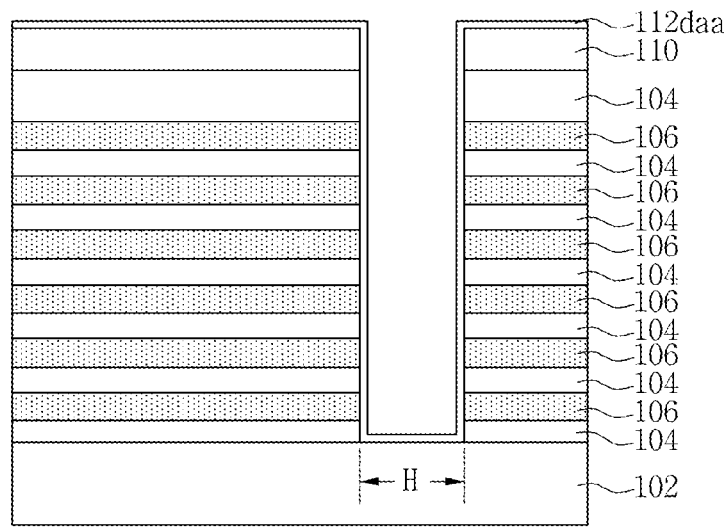
FIGS. 6A to 6D illustrate process cross-sectional views showing a method of fabricating a vertical cell-type semiconductor device according to example embodiments of inventive concepts in a process sequence.

Referring to FIG. 6A, a method of fabricating a vertical cell-type semiconductor device 100C according to example embodiments of inventive concepts may include alternately stacking a plurality of interlayer insulating layers 104 and a plurality of sacrificial layers 106 on a substrate 102 to form a preliminary stacked structure 108, forming a first capping layer 110 on the preliminary stacked structure 108, and forming a through-hole H passing through the first capping layer 110 and the preliminary stacked structure 108. Further, the method may include forming a first dielectric layer 112*daa* on an inner wall of the through-hole H. The first dielectric layer 112*daa* may include silicon nitride.

Figure 6B:
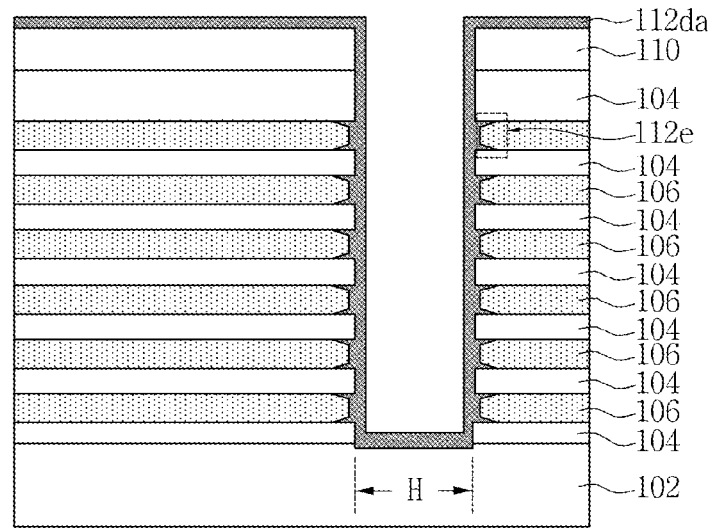

Referring to FIG. 6B, the method of fabricating the vertical cell-type semiconductor device 100C according to example embodiments of inventive concepts may include oxidizing the first dielectric layer 112*daa* and a part of each sacrificial layer 106 to form an oxide layer 112*da*, and forming protective patterns 112*e* extending from the oxide layer 112*da*. Here, the process of oxidizing the first dielectric layer 112*daa* and the interlayer insulating layer 104 may include causing oxygen radicals to penetrate the first dielectric layer and the interlayer insulating layer 104 to react with silicon atoms. The oxidation reaction of the silicon atoms may begin from a surface of the first dielectric layer 112*daa* to proceed to a part of each sacrificial layer 106. The protective patterns 112*e* may be formed by the oxidation reaction.

Figure 6C:
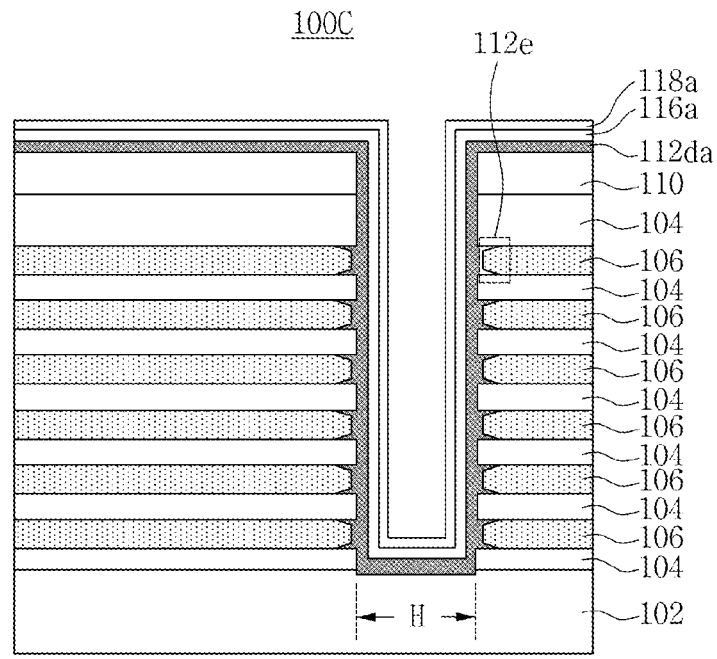

Referring to FIG. 6C, a method of fabricating the vertical cell-type semiconductor device 100C according to example embodiments of inventive concepts may include conformally forming a second dielectric layer 116*a* on the exposed surface of the oxide layer 112*da*, and conformally forming a third dielectric layer 118*a* on the second dielectric layer 116*a*. The second dielectric layer 116*a* may include silicon nitride, and the third dielectric layer 118*a* may include silicon oxide.

Figure 6D:
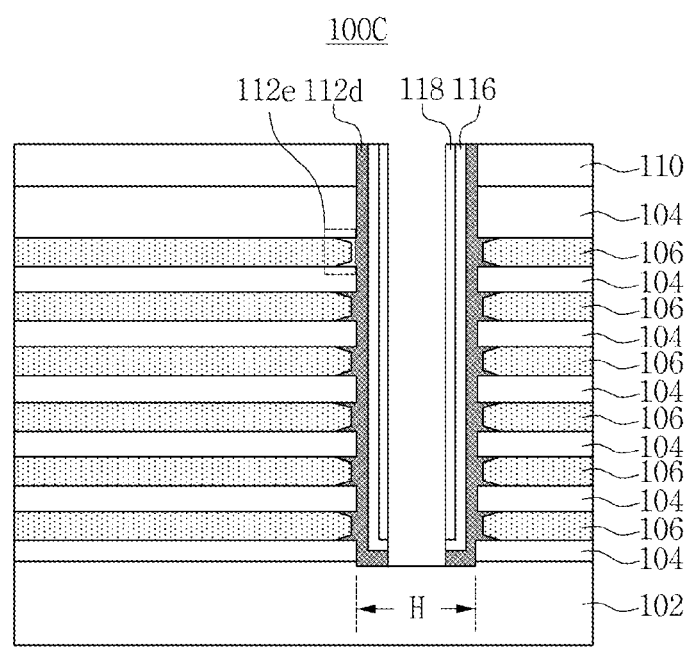

Referring to FIG. 6D, the method may include etching an oxide layer 112*da*, a second dielectric layer 116*a*, and a third dielectric layer 118*a* to form a protective layer 112*d*, a charge trap layer 116, and a tunneling layer 118. The protective layer 112*d* and the protective patterns 112*e* has etching resistance to an etchant for removing the sacrificial layers 106, and simultaneously performs a barrier function. For example, the barrier layer 114 may be omitted. The following processes are equal to those described with reference to FIGS. 4F to 4Q, and description thereof will be omitted.

Figure 7:
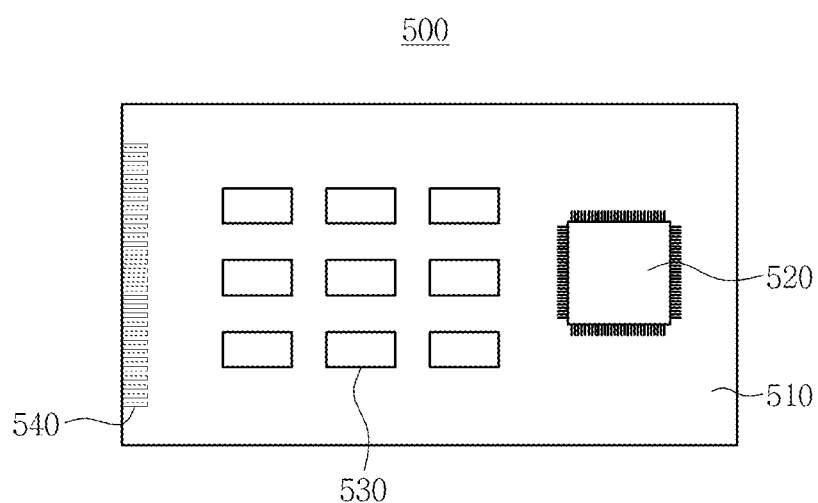
FIG. 7 illustrates a conceptual view showing a semiconductor module, which includes one of the semiconductor devices according to example embodiments of inventive concepts.

FIG. 7 illustrates a conceptual view showing a semiconductor module, which includes a semiconductor devices according to example embodiments of inventive concepts.

Referring to FIG. 7, a semiconductor module 500 according to example embodiments of inventive concepts may include a semiconductor device according to example embodiments of inventive concepts (e.g., one of the semiconductor devices 100A, 100B, and 100C according to example embodiments of inventive concept) that is mounted on a semiconductor module board 510. The semiconductor module 500 may further include a microprocessor 520 mounted on the module board 510. Input/output terminals 540 may be disposed on at least one side of the module board 510. The semiconductor module 500 may include a memory card or a solid state drive (SSD).

Figure 8:
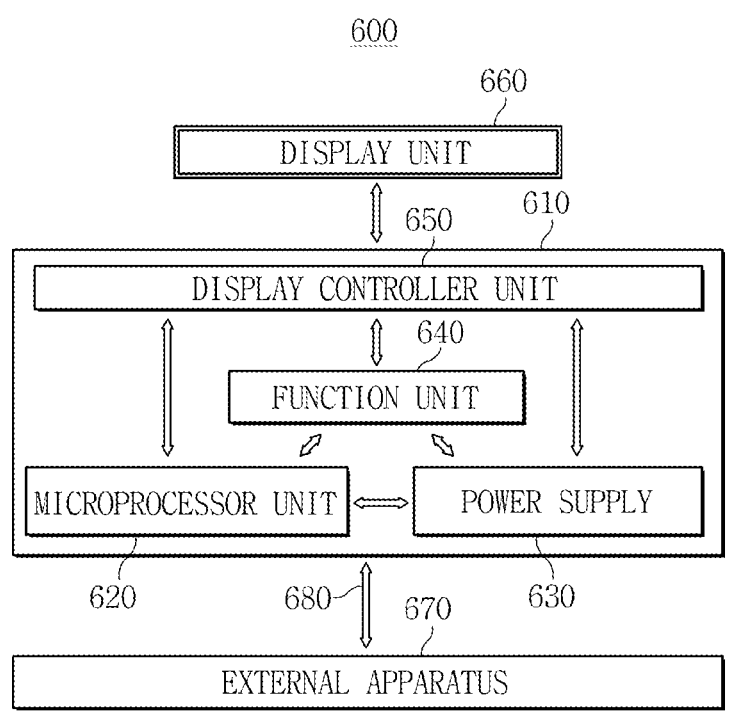
FIG. 8 illustrates a conceptual block diagram showing an electromagnetic system, which includes one of the semiconductor devices according to example embodiments of inventive concepts.

FIG. 8 illustrates a conceptual block diagram showing an electromagnetic system, which includes a semiconductor devices according to example embodiments of inventive concepts.

Referring to FIG. 8, one of the semiconductor devices 100A, 100B, and 100C according to example embodiments of inventive concepts may be applied to an electromagnetic system 600. The electromagnetic system 600 may include a body 610, a microprocessor unit 620, a power distributor 630, a function unit 640, and/or a display controller unit 650. The body 610 may be a system board or a motherboard having a printed circuit board (PCB). The microprocessor unit 620, the power distributor 630, the function unit 640, and the display controller unit 650 may be mounted on the body 610. A display unit 660 may be disposed on the top of the body 610 or outside the body 610. For example, the display unit 660 may be disposed on a surface of the body 610, and display an image processed by the display controller unit 650. The power supply 630 may be supplied with a desired (and/or alternatively predetermined) voltage from an external power supply, divide the voltage into various levels, and supply those voltages to the microprocessor unit 620, the function unit 640, and the display controller unit 650. The function unit 640 may perform various functions of the electromagnetic system 600. For example, if the electromagnetic system 600 is a mobile electromagnetic appliance such a mobile phone, the function unit 640 may include various components that can perform wireless communication functions such as image output, or voice output to a speaker, by dialing or communication with an external apparatus 670. If the electromagnetic system 600 includes a camera, the function unit 640 may serve as an image processor. In example embodiments, if the electromagnetic system 600 is connected to a memory card for capacity expansion, the function unit 640 may be a memory card controller. The function unit 640 may send/receive a signal to/from the external apparatus 670 via a wired or wireless communication unit 680. Further, if the electromagnetic system 600 requires a universal serial bus (USB) for function expansion, the function unit 640 may serve as an interface controller. One of the semiconductor devices 100A, 100B, and 100C according to example embodiments of inventive concepts may be included in the function unit 640.

Figure 9:
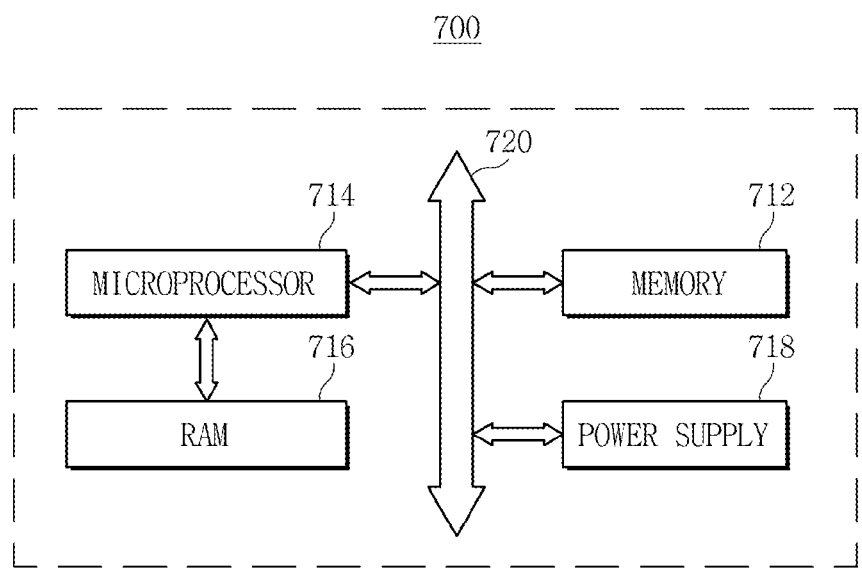
FIG. 9 illustrates a schematic block diagram showing an electromagnetic system, which includes a semiconductor device according to example embodiments of inventive concepts.

FIG. 9 illustrates a schematic block diagram showing an electromagnetic system, including a semiconductor device according to example embodiments of inventive concepts.

Referring to FIG. 9, an electromagnetic system 700 may include one of the semiconductor devices 100A, 100B, and 100C described previously.

The electromagnetic system 700 may be applied to a mobile electromagnetic appliance or a computer. For example, the electromagnetic system 700 may include a memory 712, a microprocessor 714, and a user interface 718 performing data communication using a random access memory (RAM) 716 and a bus 720. The microprocessor 714 may program and control the electromagnetic system 700. The RAM 716 may be used as an operation memory of the microprocessor 714. For example, the microprocessor 714 or the RAM 716 may include one of the semiconductor devices 100A, 100B, and 100C according to example embodiments of inventive concepts.

The microprocessor 714, the RAM 716, and/or other components may be assembled in a single package. The user interface 718 may be used to input/output data to/from the electromagnetic system 700. The memory 712 may store codes for operating the microprocessor 714, data processed by the microprocessor 714, or external input data. The memory 712 may include a controller and a memory.

Figure 10:
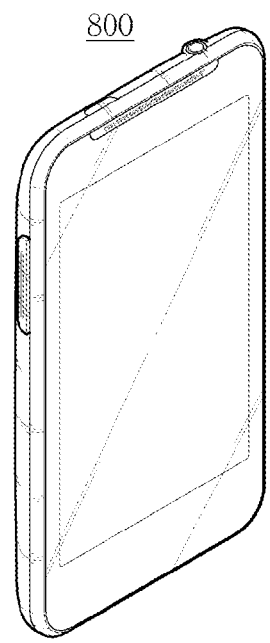
FIG. 10 schematically illustrates a mobile electromagnetic appliance, which includes a semiconductor devices according to example embodiments of inventive concepts.

FIG. 10 schematically shows a mobile electromagnetic appliance, which includes one of the semiconductor devices according to example embodiments of inventive concepts. The mobile electromagnetic appliance 800 may be understood to be a tablet personal computer (PC). In addition, at least one of the semiconductor devices 100A, 100B, and 100C according to example embodiments of inventive concepts may be used for a portable computer, such as a laptop computer, a MPEG-1 or MPEG-2 Audio Layer III (MP3) player, an MP4 player, a navigation device, a solid state disk (SSD), a desktop computer, a vehicle, and a household electric appliance, in addition to the tablet PC.

According to example embodiments of inventive concepts, the protective patterns can reduce (and/or prevent) a wet etching solution from causing damage to the gate dielectric layers (charge trap layer, tunneling layer, etc.) and the channel pattern.

Further, since each protective pattern is formed within a desired (and/or alternatively predetermined) space so as to enclose one side of each gate electrode, each gate electrode can be formed in a shape in which the vertical width thereof is reduced with the approach to one side thereof. In this case, no or minimum voids or seams can be present in each gate electrode.

The foregoing disclosure is illustrative of example embodiments of inventive concepts and is not to be construed as limiting thereof. Although a few embodiments have been described, those skilled in the art will readily appreciate that many modifications are possible without materially departing from the scope of the claims. Accordingly, all such modifications are intended to be included within the scope of example embodiments of inventive concepts as defined in the claims. In the claims, means-plus-function clauses are intended to cover the structures described herein as performing the recited function, and not only structural equivalents but also equivalent structures.

What is claimed is:

1. A semiconductor device, comprising:
    a substrate;
    a stacked structure including interlayer insulating layers and gate electrodes alternately stacked on the substrate, the stacked structure defining a through-hole, each of the gate electrodes including a portion in which a vertical width thereof is reduced with the approach to one end thereof; and
    a vertical structure in the through-hole, the vertical structure including a gap-fill pattern in a middle of the through-hole, a channel pattern surrounding an outer surface of the gap-fill pattern, and a gate dielectric layer surrounding an outer surface of the channel pattern, and
    the gate dielectric layer includes a tunneling layer in contact with the channel pattern, a charge trap layer in contact with the tunneling layer, a barrier layer in contact with the charge trap layer, and protective patterns,
    each one of the protective patterns being between the barrier layer and one of the gate electrodes, and
    each one of the protective patterns extending between two of the interlayer insulating layers and the protective patterns surround the portions of the gate electrodes in which the vertical width thereof is reduced, wherein
    the protective patterns include an oxide of silicon.

2. The semiconductor device of claim 1, wherein
    each one of the gate electrodes includes an upper surface opposite a lower surface, a first lateral surface opposite a second lateral surface, and an upper inclined surface opposite a lower inclined surface,
    the first lateral surface connects one end of the upper surface to one end of the lower surface,
    the upper inclined surface connecting one end of the second lateral surface and another end of the upper surface,
    the lower inclined surface connecting another end of the second lateral surface and another end of the lower surface, and
    a length of the second lateral surface is shorter than a length of the first lateral surface.

3. The semiconductor device of claim 2, wherein each one of the protective patterns includes:
    an upper part between a lower surface of one of the interlayer insulating layers above and the upper inclined surface of an adjacent one of the gate electrodes;

a lower part between the lower surface of one of the interlayer insulating layers below and the lower inclined surface of the adjacent one of the gate electrodes, and a body part connecting the upper part to the lower part.

4. The semiconductor device of claim 3, wherein the upper part of each one of the protective patterns includes an inclined upper inner surface in contact with the upper inclined surface of one of the gate electrodes, and the lower part of each one of the protective patterns includes an inclined lower inner surface in contact with the lower inclined surface of one of the gate electrodes.

5. The semiconductor device of claim 4, further comprising:

blocking layers, each of one of the blocking layers having one surface in contact with the upper surface, lower surface, upper inclined surface, lower inclined surface, and second lateral surface of one of the gate electrodes, and each one of the blocking layer having another surface in contact with parts of two interlayer insulating layers, the inclined upper inner surface and the inclined lower inner surfaces and one surface of the body part of one of the protective patterns.

6. The semiconductor device of claim 3, wherein the body part of each one of the protective patterns includes a protrusion that protrudes into the through-hole.

7. The semiconductor device of claim 6, wherein the barrier layer contacts exposed lateral surfaces of the interlayer insulating layers and the protrusions of the body parts of the protective patterns.

8. The semiconductor device of claim 1, wherein the channel pattern contacts a surface of the substrate that defines a bottom surface of the through-hole.

9. The semiconductor device of claim 1, further comprising:

a contact electrode on the gap-fill pattern and contacting the channel pattern.

10. The semiconductor device of claim 9, further comprising:

capping layers on the stacked structure, wherein the capping layers define a hole exposing an upper surface of the contact electrode.

11. The semiconductor device of claim 10, further comprising:

a conductive interconnection on the capping layers, wherein the conductive interconnection is electrically connected to the exposed upper surface of the contact electrode.

12. A semiconductor device, comprising:

a substrate;

a stacked structure including interlayer insulating layers and gate electrodes alternately stacked on the substrate, the stacked structure defining a through-hole, each of the gate electrodes including a portion in which a vertical width thereof is reduced with the approach to one end thereof; and a vertical structure in the through-hole, the vertical structure including a gap-fill pattern in a middle of the through-hole, a channel pattern surrounding an outer surface of the gap-fill pattern, and a gate dielectric layer surrounding an outer surface of the channel pattern, and the gate dielectric layer includes a tunneling layer in contact with the channel pattern, a charge trap layer in contact with the tunneling layer, a protective layer in contact with the charge trap layer, and protective patterns that are integral with the protective layer, the protective patterns extending to the gate electrodes, and surround the portions of the gate electrodes in which the vertical width is reduced; and a barrier layer between the charge trap layer and the protective patterns.

13. The semiconductor device of claim 12, wherein the protective patterns include an oxide of silicon.

14. A semiconductor device, comprising:

a substrate;

a stacked structure including interlayer insulating layers and gate electrodes alternately stacked on the substrate, the stacked structure defining a through-hole over the substrate, the gate electrodes each including a first portion between the through-hole and a second portion of the gate electrodes;

a channel pattern extending vertically in the through-hole over the substrate, the channel pattern arranged such that a horizontal distance between the channel pattern to the first portion of the gate electrodes is greater than a horizontal distance between the channel pattern to the interlayer insulating layers;

a tunneling layer surrounding the channel pattern;

a charge trap layer surrounding the tunneling layer; and protective patterns surrounding the first portions of the gate electrodes, the protective patterns between the first portions of the gate electrodes and the charge trap layer, wherein a material of the protective patterns is the same as a material of the protective layer, and the protective patterns are integral with the protective layer.

15. The semiconductor device of claim 14, wherein the first portions of the gate electrodes each have a thickness that gradually reduces from the second portions of the gate electrodes towards the through-hole, and the protective patterns do not surround the second portions of the gate electrodes.

16. The semiconductor device of claim 14, further comprising:

a barrier layer between the protective patterns and the charge trap layer.

17. The semiconductor device of claim 14, further comprising:

a protective layer that extends vertically in the through-hole between the charge trap layer and the protective patterns, wherein each one of the protective patterns extends from a side of the protective layer to surround the first portion of one of the gate electrodes.

18. The semiconductor device of claim 14, wherein the protective patterns include an oxide of silicon, the interlayer insulating layers include an oxide, and the oxide of silicon in the protective patterns is more compact than the oxide of the interlayer insulating layers.

19. The semiconductor device of claim 1, wherein a horizontal distance between the portion of the gate electrodes and the channel layer is greater than a horizontal distance between the channel layer to the interlayer insulating layers.

20. The semiconductor device of claim 14, further comprising:

a protective layer that extends vertically in the through-hole between the charge trap layer and the protective patterns, wherein each one of the protective patterns extends from a side of the protective layer to surround the portion of one of the gate electrodes.

21. The semiconductor device of claim 12, wherein a material of the protective patterns is the same as a material of the protective layer.

22. The semiconductor device of claim 1, wherein
the charge trap layer includes one of silicon nitride, aluminum oxide, zirconium oxide, hafnium oxide, lanthanum oxide,
the tunneling layer includes one of silicon oxide and nitrogen-doped silicon oxide, and
the barrier layer includes an oxide.

* * * * *